(12) United States Patent
Kim et al.

(10) Patent No.: US 10,660,204 B2
(45) Date of Patent: May 19, 2020

(54) DEVICE FOR FIXING CAMERA MODULE CIRCUIT BOARD, AND CAMERA MODULE

(71) Applicant: LG INNOTEK CO., LTD., Seoul (KR)

(72) Inventors: Kwang Sung Kim, Seoul (KR); Ji Hwan Park, Seoul (KR); Yong Tae Park, Seoul (KR); Beom Seok Yu, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/093,040

(22) PCT Filed: Apr. 14, 2017

(86) PCT No.: PCT/KR2017/004064
§ 371 (c)(1),
(2) Date: Oct. 11, 2018

(87) PCT Pub. No.: WO2017/179943
PCT Pub. Date: Oct. 19, 2017

(65) Prior Publication Data
US 2019/0132954 A1 May 2, 2019

(30) Foreign Application Priority Data

Apr. 14, 2016 (KR) .................. 10-2016-0045409
Jul. 21, 2016 (KR) .................. 10-2016-0092447

(51) Int. Cl.
*H05K 1/14* (2006.01)
*G02B 7/02* (2006.01)
(Continued)

(52) U.S. Cl.
CPC ............. *H05K 1/144* (2013.01); *G02B 7/02* (2013.01); *G03B 11/04* (2013.01); *G03B 17/08* (2013.01);
(Continued)

(58) Field of Classification Search
USPC ......................................... 361/742
See application file for complete search history.

(56) References Cited

U.S. PATENT DOCUMENTS 4,533,976 A     8/1985  Suwa
5,381,176 A *   1/1995  Tanabe ................ G11B 31/006
                                                348/273
(Continued)

FOREIGN PATENT DOCUMENTS

EP        3 086 545 A1      10/2016
KR     20-1998-0032533 U     9/1998
(Continued)

OTHER PUBLICATIONS

Supplementary European Search Report dated Jan. 24, 2019 in European Application No. 17782698.9.
(Continued)

*Primary Examiner* — Hung S. Bui
(74) *Attorney, Agent, or Firm* — Saliwanchik, Lloyd & Eisenschenk

(57) ABSTRACT

A device for fixing a camera module, comprising: a base part; and a fixing unit including a first fixing part for supporting one side of each of a plurality of boards, and a second fixing part for supporting the other side facing one side of each of the plurality of boards, wherein the plurality of first fixing parts extends in a first direction from the base part, and includes a plurality of protruding parts protruding in the direction perpendicular to the first direction in order to support one side of each of the plurality of boards, and the plurality of second fixing parts extends in the first direction from the base part, and includes a plurality of protruding parts for supporting the other side of each of the plurality of boards.

20 Claims, 19 Drawing Sheets

(51) Int. Cl.
  *G03B 17/08* (2006.01)
  *G03B 17/56* (2006.01)
  *G03B 11/04* (2006.01)
  *H04N 5/225* (2006.01)
  *H05K 1/02* (2006.01)
  *H05K 1/18* (2006.01)

(52) U.S. Cl.
  CPC .......... *G03B 17/56* (2013.01); *H04N 5/2252* (2013.01); *H04N 5/2253* (2013.01); *H04N 5/2254* (2013.01); *H05K 1/028* (2013.01); *H05K 1/0254* (2013.01); *H05K 1/147* (2013.01); *H05K 1/181* (2013.01); *H05K 2201/042* (2013.01); *H05K 2201/10121* (2013.01); *H05K 2201/10151* (2013.01); *H05K 2201/2018* (2013.01)

(56) References Cited

U.S. PATENT DOCUMENTS

| | | | | |
|---|---|---|---|---|
| 8,970,700 | B2* | 3/2015 | Inoue | H04N 5/2252 348/148 |
| 2008/0024883 | A1* | 1/2008 | Iwasaki | G02B 7/022 359/808 |
| 2009/0162006 | A1 | 6/2009 | Yamanouchi et al. | |
| 2010/0103617 | A1* | 4/2010 | Soma | H05K 7/1417 361/697 |
| 2011/0063496 | A1 | 3/2011 | Chang | |
| 2011/0199485 | A1* | 8/2011 | Nakamura | G02B 13/001 348/148 |
| 2013/0321696 | A1 | 12/2013 | Bae | |
| 2014/0320657 | A1* | 10/2014 | Han | B60R 11/04 348/148 |
| 2017/0320449 | A1* | 11/2017 | Park | H04N 5/2257 |
| 2019/0121050 | A1* | 4/2019 | Park | B29C 65/48 |

FOREIGN PATENT DOCUMENTS

| KR | 10-2008-0052862 A | 6/2008 |
|---|---|---|
| KR | 10-2010-0048101 A | 5/2010 |
| KR | 10-1131622 B1 | 3/2012 |
| KR | 10-2013-0050767 A | 5/2013 |

OTHER PUBLICATIONS

International Search Report in International Application No. PCT/KR2017/004064, filed Apr. 14, 2017.

* cited by examiner

DEVICE FOR FIXING CAMERA MODULE CIRCUIT BOARD, AND CAMERA MODULE

CROSS-REFERENCE TO RELATED APPLICATIONS

This application is the U.S. national stage application of International Patent Application No. PCT/KR2017/004064, filed Apr. 14, 2017, which claims the benefit under 35 U.S.C. § 119 of Korean Application Nos. 10-2016-0045409, filed Apr. 14, 2016, and 10-2016-0092447, filed Jul. 21, 2016 the disclosures of each of which are incorporated herein by reference in their entirety.

TECHNICAL FIELD

The teachings in accordance with exemplary and non-limiting embodiments of this invention relate generally to a device for fixing camera module circuit board and a camera module.

BACKGROUND ART

This section provides background information related to the present invention, which is not necessarily prior art.

Recently, small IT devices such as smartphones, tablet PCs and gamers are mounted with camera modules and vehicles are also mounted with camera modules for running record and parking conveniences.

Recently, camera modules mounted on vehicles perform various additional functions in addition to functions to display images. As a result, the camera modules are mounted with various devices along with an image sensor, and size of circuit board used for the camera module is gradually increased.

However, the size of camera module is restricted, and recently, in order to satisfy the limited size of camera module and required area of circuit board, a technology of stacking up a plurality of small-sized circuit boards inside the camera module has been developed.

The Korea patent publication No.: 10-2010-0048101, entitled as "vehicular camera module (published on May 11, 2010" discloses a technology in which a plurality of circuit boards is stacked up inside a camera module, and each circuit board is coupled to a housing by a fastening screw.

However, the vehicular camera module suffers from disadvantages in that the circuit boards are coupled to the housing by a fastening screws to increase the number of assembly processes, a manufacturing cost caused by screw fastening, and to decrease a parts mounting area of circuit board caused by screw fastening, whereby an increased number of circuit boards and bending phenomenon of circuit boards may be disadvantageously generated.

Meantime, a vehicle may be mounted with camera modules of various purposes. For example, when a vehicle is parked, a camera module capable of obtaining a rear visual range may be mounted on a rear side of the vehicle.

Furthermore, camera modules may be also used for vehicular black box that is very usefully employed in order to trace accident causes and accident circumstances when traffic accidents occur. Moreover, the trend is that the camera modules are gradually used as a recognition device in order to easily and clearly grasp a circumstance of a blind spot that cannot be visually ascertained by a driver or a passenger of a vehicle.

Recently, the trend is that manufacturing of smart cars, that is, vehicles mounted with a collision warning system detecting and inhibiting in advance a collision possibility at front and rear sides at the time of travel of vehicles, and a collision avoidance system by a control device capable of directly avoiding collision between vehicles that travel by the control device mounted on the vehicle, is on the increase.

Thus, use of camera modules as recognition means of external circumstances of smart cars is on the increase, and as a result, manufacturing and technical development of camera modules are also on the increasing trend.

DETAILED DESCRIPTION OF THE INVENTION

Technical Subject

Exemplary embodiments of the present invention provide a device for fixing camera module circuit board configured to inhibit an increased number of assembly processes, to reduce a manufacturing cost, to inhibit a decreased parts mounting area of circuit board and to inhibit bending of circuit board by fixing the circuit board inside a housing without using a coupling screw when the circuit board is fixed inside the housing, and a camera module including the device for fixing camera module circuit board.

Furthermore, exemplary embodiment of the present invention relates to a camera module having a structure configured to inhibit decreased image quality caused by static electricity and to inhibit decreased EMC (Electro Magnetic Compatibility).

The technical subjects to be implemented by the exemplary embodiments are not limited to the abovementioned technical subjects, and other technical subjects not mentioned above may be clearly appreciated by the skilled in the art through the following descriptions.

Technical Solution

A device for fixing a camera module circuit board (hereinafter referred to as "camera module circuit board fixing device", and more simply as "device") according to an exemplary embodiment is provided, comprising:

a base part; and a fixing unit including a first fixing part for supporting one side of each of a plurality of boards, and a second fixing part for supporting the other side facing one side of each of the plurality of boards, wherein the plurality of first fixing parts extends in a first direction from the base part, and includes a plurality of protruding parts protruding in the direction perpendicular to the first direction in order to support one side of each of the plurality of boards, and the plurality of second fixing parts extends in the first direction from the base part, and includes a plurality of protruding parts for supporting the other side of each of the plurality of boards.

Preferably, but not necessarily, the first fixing part may be extensively disposed from a corner area mutually opposite to the base part, and the protruding parts of first fixing part may be formed by bending an area protruded from a lateral surface of the first fixing part.

Preferably, but not necessarily, the first fixing part may be such that a pair of first fixing parts is disposed on the base part, each facing the other first fixing part, and the protruding parts of first fixing parts may be so formed as to protrude into an inner space mounted with the board.

Preferably, but not necessarily, a protruding length of the first fixing part may be decreased while being distanced from the base part.

Preferably, but not necessarily, the second fixing part may be formed by extending to the first direction from mutually parallel sides of the base part, and the protruding parts of the second fixing part may protrude toward an inner space mounted with the board in order to support the other side of the board.

Preferably, but not necessarily, the second fixing part may be formed with a sill formed between the protruding parts of second fixing part.

Preferably, but not necessarily, the first fixing part may be formed with a first width, and the second fixing part may be formed with a second width narrower than the first width.

Preferably, but not necessarily, the plurality of boards may include a rigid circuit board in which a plurality of vertically mutually opposite boards is stacked up, and a flexible circuit board mutually and electrically connecting the rigid circuit boards.

Preferably, but not necessarily, the boards may be respectively formed with escape grooves, each having a mutually different size, in order to inhibit interference with at least a portion of protruding parts among the protruding parts of the first fixing part.

A camera module according to an exemplary embodiment of the present invention comprises:

a fixing unit including a base part and a first fixing part for supporting one side of each of a plurality of boards, and a second fixing part for supporting the other side facing one side of each of the plurality of boards;

an image sensor mounted on a board disposed at an uppermost area in the plurality of boards;

a lens disposed on a path of a light introduced into the image sensor;

a lens barrel fixing the lens; and a housing accommodating the fixing unit, the image sensor and the lens, wherein the plurality of first fixing parts extends in a first direction from the base part, and includes a plurality of protruding parts protruding in a direction perpendicular to the first direction in order to support one side of each of the plurality of boards, and the plurality of second fixing parts extends in the first direction from the base part, and includes a plurality of protruding parts for contacting the other side of each of the plurality of boards.

A camera module according to an exemplary embodiment of the present invention comprises:

a lens part;

a hollowed front body accommodating the lens part in an inner space;

a board part disposed at a rear side of the front body and formed with a plurality of PCBs (Printed Circuit Boards);

a first fence coupled to the board to mutually spacing the plurality of PCBs apart to an optical axis direction;

a second fence coupled to the first fence a rear side of the first fence; and a finger electrically connecting the board part and the second fence.

Preferably, but not necessarily, the plurality of PCBs may include a first board so disposed as to face the lens part, a third board so disposed as to be spaced apart from the first board to an optical axis direction, and a second board respectively spaced apart from the first board and the third board in between the first board and the third.

Preferably, but not necessarily, the finger may be electrically connected to the second fence and the third board.

Preferably, but not necessarily, the finger may include a board coupling part coupled to the third board, and an elastic deformation part extensively formed from the board coupling part, and elastically deformed, wherein the second fence and the third board are mutually and electrically connected when the second fence applies a pressure to the elastic deformation part.

Preferably, but not necessarily, the second fence may include a pressure part protrusively formed to a direction of board part to apply a pressure to the finger.

Preferably, but not necessarily, the first fence may be formed at one side with a body coupling part coupled with the front body, wherein the front body, the body coupling part and the first board may be mutually coupled by a coupling device.

Preferably, but not necessarily, the first fence may include a first protrusion supporting one surface of the PCB, and a second protrusion supporting the other surface of the PCB.

Preferably, but not necessarily, the second board and the third board may be coupled with the first fence by the first protrusion and the second protrusion, and the second board and the third board may be discretely disposed toward an optical axis direction.

Preferably, but not necessarily, the second fence may be formed with a hook attachably and detachably coupled with the first fence, and the first fence may be formed with a through hole coupled with the hook.

Preferably, but not necessarily, the second fence may ground the board part by being electrically connected to the board part.

Preferably, but not necessarily, the finger may be formed with a beryllium copper.

The camera module according to an exemplary embodiment of the present invention may further comprise a cable connector connecting the board part with an outside cable.

Preferably, but not necessarily, the cable connector may include a first connector coupled with the board part, and a second connector coupled with the first connector and the outside cable.

A camera module according to an exemplary embodiment of the present invention comprises:

a lens part;

a front body coupled by the lens part;

a first board so disposed as to face the lens part;

a third board so disposed as to be spaced apart from the first board to an optical axis direction;

a second board respectively spaced apart from the first board and the third board in between the first board and the third;

a first fence coupled with the first board, the second board and the third board to mutually spacing the first board, the second board and the third board apart to an optical axis direction;

a second fence coupled with the first fence; and a finger electrically connecting the second fence with the third board, wherein the finger may include a board coupling part coupled to the third board, and an elastic deformation part extensively formed from the board coupling part, and elastically deformed, wherein the second fence and the third board are mutually and electrically connected when the second fence applies a pressure to the elastic deformation part.

Advantageous Effects

A device for fixing camera module circuit board and a camera module according to exemplary embodiments of the present invention can inhibit an increased number of assembly processes, to reduce a manufacturing cost, to inhibit a decreased parts mounting area of circuit board and to inhibit bending of circuit board by securely fixing the circuit board inside a housing without using a coupling screw when the circuit board is fixed inside the housing.

The camera module according to an exemplary embodiment of present invention has an advantageous effect of easily and consistently aligning a plurality of PCBs mounted on a board part of the camera module to an optical axis direction by using a first fence including a body coupling part, a first protrusion and a second protrusion.

Furthermore, a board part and a second fence are electrically connected to allow a static electricity generated from the board part to flow to the second fence, and to allow the second fence to function as a ground part, whereby the static electricity generated from the board part can be significantly and advantageously reduced.

Still furthermore, exemplary embodiment of the present invention can inhibit a decreased image quality of camera module caused by static electricity and to inhibit a decreased EMC (Electro Magnetic Compatibility) by eliminating or significantly reducing the static electricity generated from the board part.

BEST MODE

Figure 1:
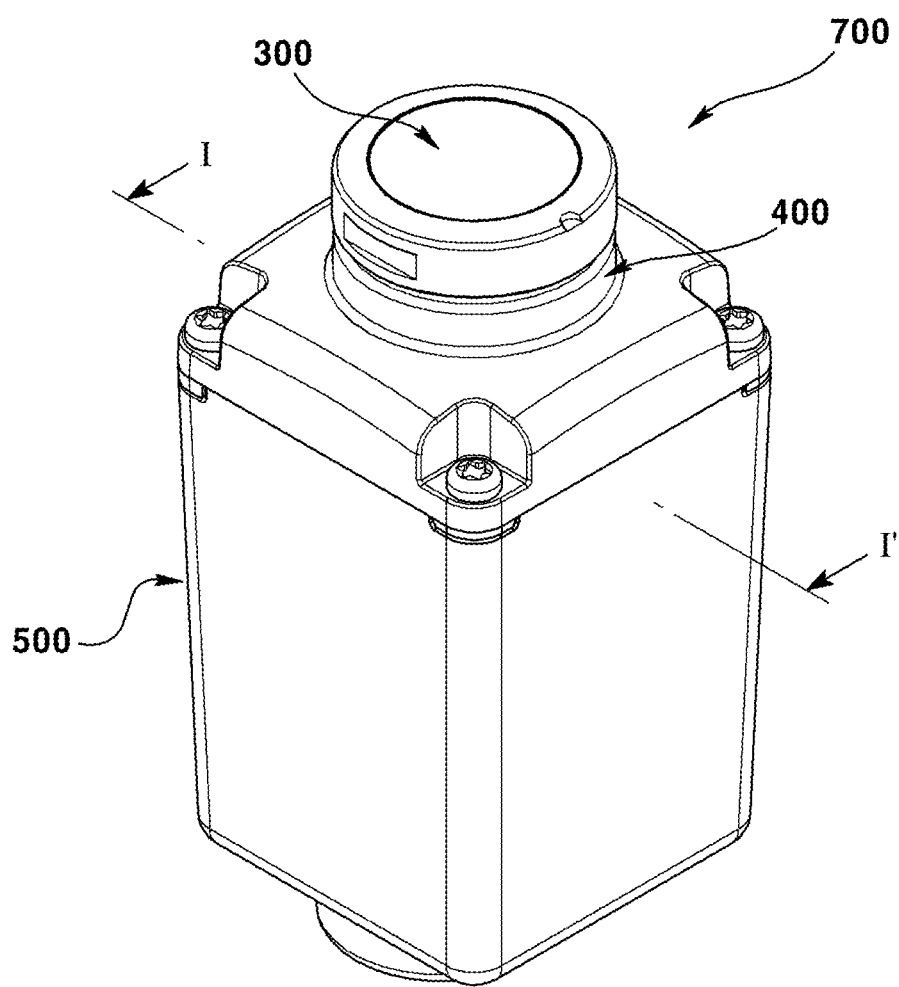
FIG. 1 is an external perspective view illustrating a camera module according to a first exemplary embodiment of present invention.

The exemplary embodiments of present invention will be described in detail with reference to the accompanying drawings. However, it should be noted that the present invention is not limited to particular exemplary embodiments, and it will be appreciated that the present invention described is intended to embrace all such alterations, modifications, and variations that fall within the scope and novel idea of the present invention.

Although the terms, first, second, etc., may be used herein to distinguish various elements, these elements should not be limited by these terms. These terms may be only used to distinguish one element from another element. Furthermore, the terms specially defined in consideration of configurations and operations of exemplary embodiments are merely to explain the exemplary embodiments and do not restrict the scope of exemplary embodiments.

It will be understood that when an element is referred to as being formed "on" or "under", it includes both cases where elements may be directly connected and/or coupled to the other elements, and where intervening elements may be indirectly present therebetween. Furthermore, when it is expressed as "on" or "under", it also includes both an upward direction and a downward direction.

Furthermore, the relational terms such as "on/upper surface/above" and "lower/bottom surface/under" do not necessarily require or contain any physical or logical relationships or sequences, and may be used to distinguish one substance or one element from other substances or other elements.

Still furthermore, an orthogonal coordinate system (x,y,z) may be used in the drawings. The x axis and y axis in the drawings may mean a plain surface perpendicular to an optical axis, and, for convenience sake, an optical axis direction (z axis direction) may be defined as a first direction, an x axis direction may be defined as a second direction, and a y axis direction may be defined as a third direction.

A camera module according to the exemplary embodiments of the present invention may have a first exemplary embodiment, a second exemplary embodiment, and a third exemplary embodiment. The camera module according the first and second exemplary embodiments relates to a camera module including a device for fixing a camera module circuit board for securely fixing a circuit board, and the camera module according to the third exemplary embodiment of the present invention concerns a camera module including a first fence and a second fence for EMC (Electro Magnetic Compatibility).

First, a camera module according to the first and second exemplary embodiments will be described.

Figure 2:
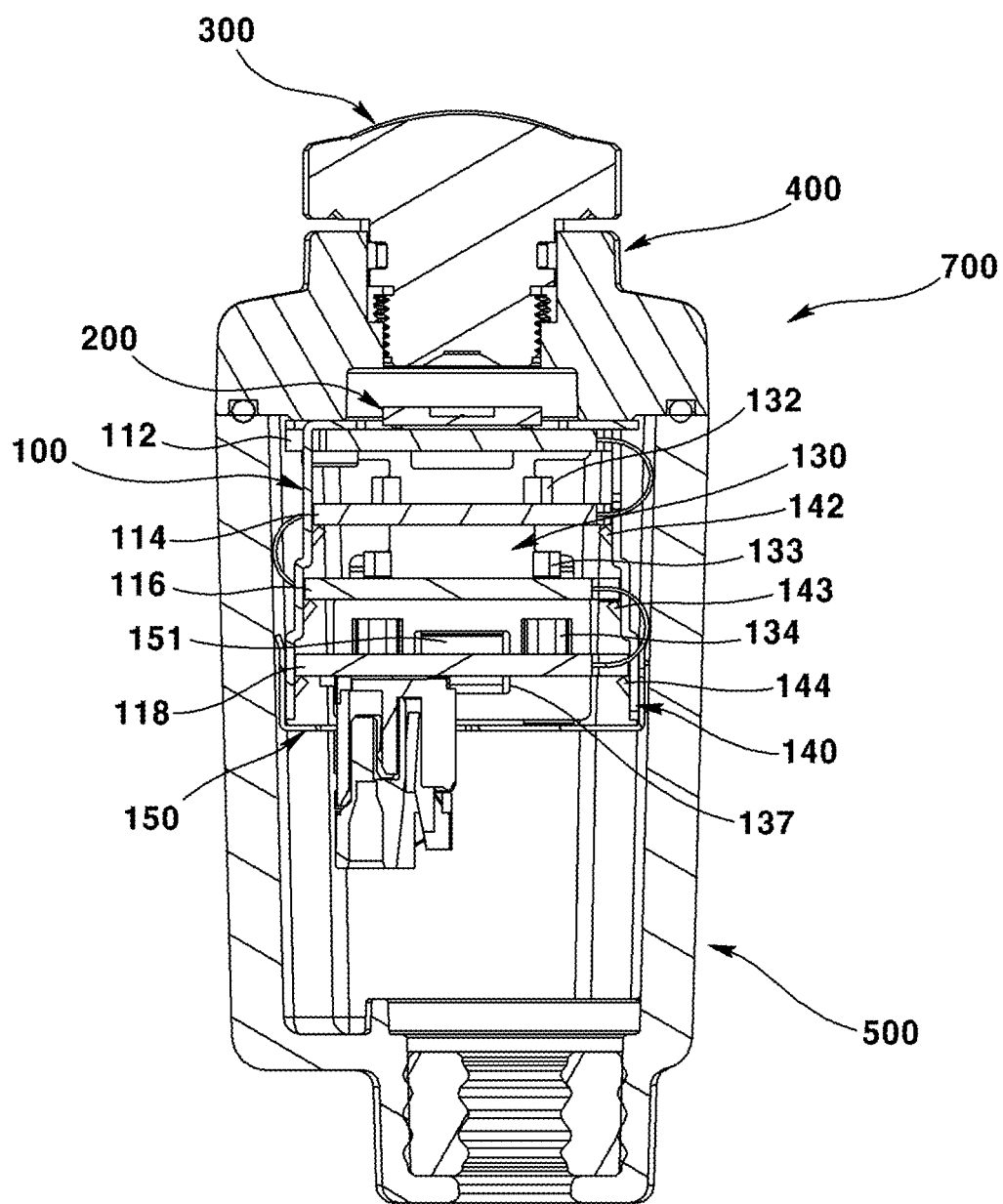
FIG. 2 is a cross-sectional view taken along line I-I' of FIG. 1.

FIG. 1 is an external perspective view illustrating a camera module according to a first exemplary embodiment of present invention, and FIG. 2 is a cross-sectional view taken along line I-I' of FIG. 1.

Referring to FIGS. 1 and 2, a camera module (700) according to the first exemplary embodiment of present invention may include a device for fixing a camera module circuit board (100, hereinafter referred to as "camera module circuit board fixing device", and more simply as "device"), an image sensor (200), a lens (300), a lens barrel (400) and a housing (500).

Figure 3:
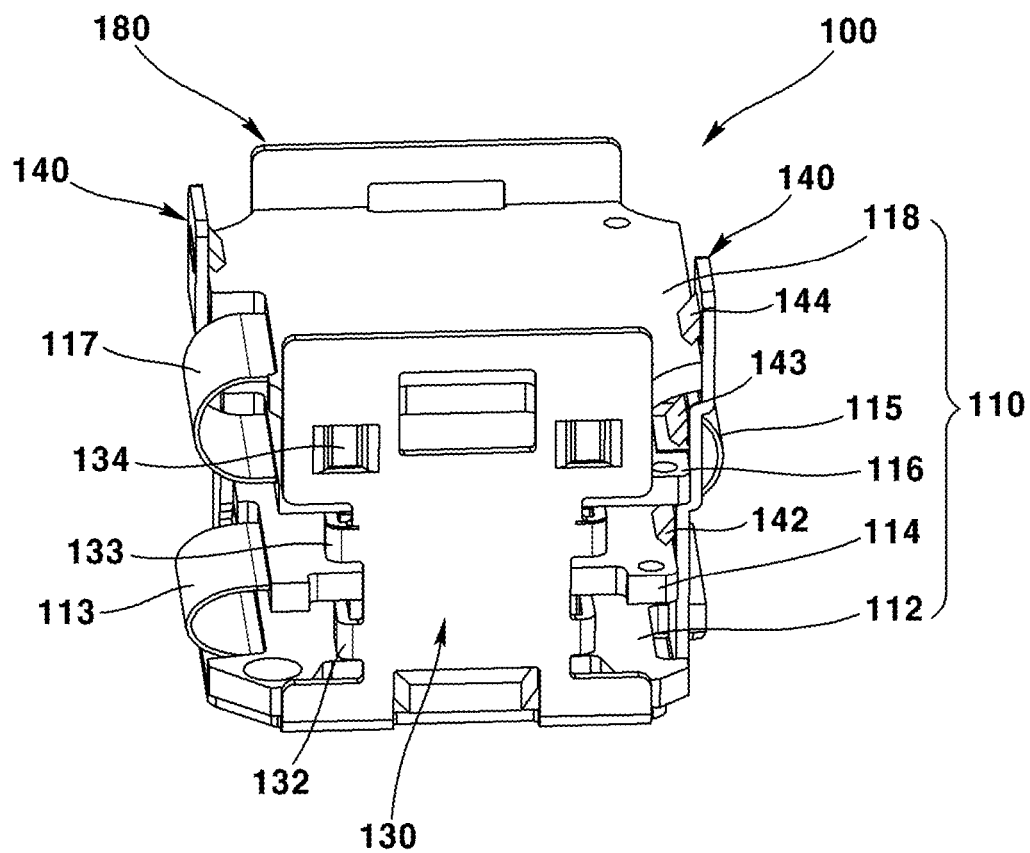
FIG. 3 is a perspective view illustrating a device for fixing a camera module circuit board ("the device", or the "camera module circuit board fixing device") of FIG. 2.

FIG. 3 is a perspective view illustrating a device for fixing a camera module circuit board ("the device", or the "camera module circuit board fixing device") of FIG. 2.

Referring to FIG. 3, the device (100) may include a fixing unit (180) fixing a plurality of circuit boards (110). The circuit board (110) according to the first exemplary embodiment of the present invention may be securely fixed by the fixing unit (180). Four circuit boards (110) according to the first exemplary embodiment may be fixed by the fixing units (180), for example.

Hereinafter, for the convenience of explanation, the circuit board (110) will be divided to a first circuit board (112), a second circuit board (114), a third circuit board (116) and a fourth circuit board (118). The first to fourth circuit boards (112,114,116,118) may respectively include a rigid circuit board.

The first circuit board (112), the second circuit board (114), the third circuit board (116) and the fourth circuit board (118) may be connected in series by the rigid circuit boards (113,115,117) according to an exemplary embodiment of the present invention.

The first and second circuit boards (112,114), the second and third circuit boards (114,116) and the third and fourth circuit boards (116,118) may be mutually and electrically connected by the rigid circuit boards (113,115,117) respectively.

The first to fourth circuit boards (112,114,116,118) may be respectively formed with a concave groove in order to inhibit each rigid circuit board (113,115,117) from being bent. The first to fourth circuit boards (112,114,116,118) may be stacked up and arranged in a zigzagged manner. For example, an upper surface of the first circuit board (112) may be disposed with the second circuit board (114), and an upper surface of second circuit board (114) may be disposed with the third circuit board (116), and an upper surface of third circuit board (116) may be disposed with the fourth circuit board (118).

The stacked-up first to fourth circuit boards (112,114,116,118) may be mutually spaced apart from each other at a predetermined distance, and the distance among the first to fourth circuit boards (112,114,116,118) may be mutually same or may be mutually different.

Meantime, an area of third circuit board (116) may be greater than that of the second circuit board (114), and an area of the fourth circuit board (118) may be greater than that of the third circuit board (116). The first circuit board (112) according to the first exemplary embodiment may be mounted with an image sensor (200), and the fourth circuit board (118) may be mounted with a connector.

Figure 4:
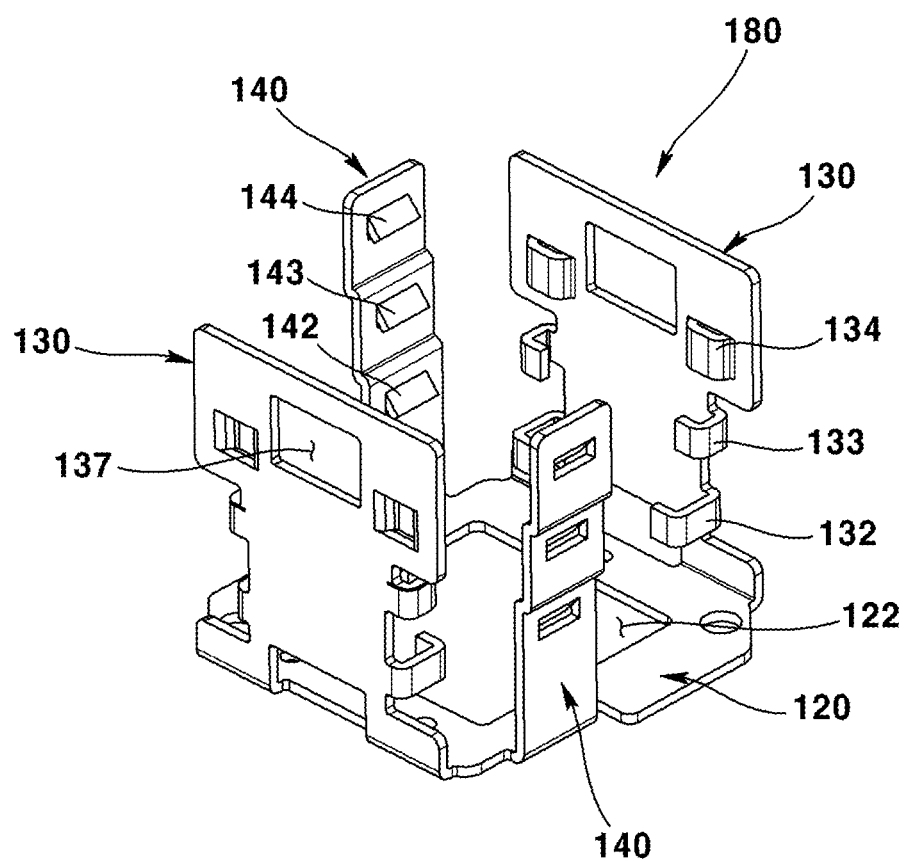
FIG. 4 is a perspective view illustrating a fixing unit of the device illustrated in FIG. 3.

FIG. 4 is a perspective view illustrating a fixing unit of the device illustrated in FIG. 3.

Referring to FIGS. 3 and 4, the fixing unit (180) may function to fix the circuit board (110) including the aforementioned first to fourth circuit boards (112,114,116,118) without recourse to screw-connection. The fixing unit (180) may include a base part (120), a first fixing part (130) and a second fixing part (140).

The base part (120), the first fixing part (130) and the second fixing part (140) according to an exemplary embodiment may be integrally formed, for example. Although the exemplary embodiment of the present invention has illustrated and explained that the base part (120), the first fixing part (130) and the second fixing part (140) are integrally formed, the base part (120), the first fixing part (130) and the second fixing part (140) may be assembled or welded while being mutually spaced apart.

The base part (120) may take a plate shape, for example, and the base part (120) may be fixed by being coupled to a housing (500, described later). The shape of base part (120) may be determined by the shape of housing (500), and when the housing (500) takes a cubic shape, the base part (120) may take a shape of a square plate adequate for being accommodated into the housing (500), for example.

The base part (120) may be formed at a center thereof with an opening (122) through which a connector can pass. At least one first fixing part (130) may be extended from an edge of the base part (120) to one side of the base part (120).

A pair of first fixing parts (130), each facing the other, according to an exemplary embodiment, may be extended from both edges (each edge facing the other) of the base part (120) to a first direction. The first direction may be a height direction relative to the base part (120), for example. The first direction may be a direction perpendicular to the base part (120), and may be formed by being extended to a direction perpendicular to a corner or an edge of base part (120).

The first fixing unit (130) may take a rectangular plate shape, for example. Although the first exemplary embodiment has illustrated and explained that the first fixing part (130) takes a rectangular plate shape, the first fixing part (130) may be formed with various plate shapes.

The first fixing part (130) may include support parts (132,133,134) protruded to a direction perpendicular to the first direction which is a height direction relative to the base part (120). The support parts (132,133,134) may function to inhibit the second to fourth circuit boards (114,116,118) from being separated. The support parts (132,133,134) of the first fixing part (130) may be called lugs of the first fixing part (130). That is, the first fixing part (130) may be extended in a plural number from the base part (120) to a first direction, and may include a plurality of lugs, each protruding to a direction perpendicular to the first direction in order to support one side of the plurality of boards (110).

The number of support parts (132,133,134) may be determined by the number of circuit boards (110). Three support parts (132,133,134), for example, in the first exemplary embodiment may be formed at the first fixing part (130) in order to support one side of second to fourth circuit boards (114,116,118) except for the first circuit board (112) arranged on the base part (120). The one side of circuit board in the present specification may be an upper surface (or lower surface) of the circuit board, and the other side of circuit board may be a lower side (or upper surface) of the circuit board.

The support part (122) supporting the second circuit board (114) may be formed, for example, by bending an area protruded from both lateral surfaces of the first fixing part (130) toward a lower surface of the second circuit board (114).

The support part (133) supporting the third circuit board (116) may be formed, for example, by bending an area protruded from both lateral surfaces of the first fixing part (130) toward a lower surface of the third circuit board (116). The support part (134) supporting the fourth circuit board (118) may be formed, for example, by cutting off a portion of the first fixing unit (130) and inwardly protruding the cut-off area from outside of the first fixing part (130).

In order to arrange the second to fourth circuit boards (114,116,118) in the first exemplary embodiment, a protruding length of the support parts (132,133,134) respectively supporting a bottom surface of the second to fourth circuit boards (114,116,118) may be intermittently shortened while being distanced from the base part (120). The size of board supported by the support part (134) may be determined in response to the protruding length of the support parts (132,133,134). The protruding length of the support parts (132,133,134) may be shortened while being distanced from the base part (120), and in order to be correspondent thereto, the size of a direction perpendicular to the first direction of the board may be also shortened while being distanced from the base part (120).

Furthermore, the second to fourth circuit boards (114,116, 118) may be formed with escape grooves for coupling without being interfered with the support parts (132,133, 134). An area of the escape groove may be so formed as to allow the second circuit board (114) to be the largest while the fourth circuit board (118) is the smallest.

Referring to FIGS. 3 and 4 again, the second fixing part (140) can inhibit the second to fourth circuit boards (114, 116,118) respectively supported by the support parts (132, 133,134) of the first fixing part (130) from being separated form an upper surface.

The second fixing part (140), a pair of second fixing parts (140), each one facing the other, for example, may be arranged to the first direction relative to the base part (120). Hence, the second fixing part (140) may be disposed in parallel with the first fixing part (130), and may be arranged perpendicularly relative to the first fixing part (130) when viewed from a plane.

When the second fixing part (140) is arranged in a pair on the base part (120) relative to the first fixing part (130), four areas of second to fourth circuit boards (114,116,118) may be stably fixed by the first and second fixing parts (130,140), whereby the second to fourth circuit boards (114,116,118) can be inhibited from being separated and from vertically moving. The second fixing part (140) may be formed from an edge of the base part (120) to the first direction.

The second fixing part (140) may take a rectangular plate shape when viewed from a lateral surface, for example. Although the first exemplary embodiment has illustrated and explained that the second fixing part (140) is formed with a square plate shape, alternatively, the second fixing part (140) may be formed with various plate shapes.

A width of second fixing part (140) may be formed narrower than the width of first fixing part (130), which is to inhibit an area formed with the second fixing part (140) from being interfered with the flexible circuit boards (113,115, 117) that connect the first to fourth circuit boards (112,114, 116,118).

The second fixing part (140) may be formed with protrusions (143, 143,144) relative to the base (120) along the height direction. The second fixing part (140) may include protrusions that are extended in plural number from the base part (120) to the first direction, and support or contact the other sides of the plurality of boards (110). The first direction may be a direction perpendicular to the base part (120). The protrusions (142,143,144) may be formed on a position corresponding to the second to fourth circuit boards (114, 116,118) except the first circuit board (112) arranged on an upper surface of base part (120).

The protrusion (142) formed on the second fixing part (140) in the first exemplary embodiment may contact or apply a pressure an upper surface of second circuit board (114), where the second circuit board (114) may not be vertically moved by the support part (132) of first fixing part (130) and the protrusion (142) of second fixing part (140).

The protrusion (142) fixing the second circuit board (114) may be formed by cutting off a portion of the second fixing part (140), and bending the cut-off portion toward an upper surface of the second circuit board (114).

The protrusion (143) formed on the second fixing part (140) in the first exemplary embodiment may contact or apply a pressure to an upper surface of third circuit board (116), where the third circuit board (116) may not be vertically moved by the support part (133) of first fixing part (130) and the protrusion (143) of second fixing part (140).

The protrusion (143) fixing the third circuit board (116) may be formed by cutting off a portion of the second fixing part (140), and bending the cut-off portion toward an upper surface of the third circuit board (116).

The protrusion (144) formed on the second fixing part (140) in the second exemplary embodiment may contact or apply a pressure to an upper surface of fourth circuit board (118), where the fourth circuit board (118) may not be vertically moved by the support part (134) of first fixing part (130) and the protrusion (144) of second fixing part (140).

The protrusion (144) fixing the fourth circuit board (118) may be formed by cutting off a portion of the second fixing part (140), and bending the cut-off portion toward an upper surface of the fourth circuit board (118).

The second to fourth circuit boards (114,116,118) fixed by the protrusions (142,143,144) according to the first exemplary embodiment are gradually increased in plain surfaces thereof, as explained above, such that a step portion may be formed on the respective protrusions (142,143,144) of the second fixing part (140) in consideration of the plain surfaces of the second to fourth circuit boards (114,116,118).

Figure 5:
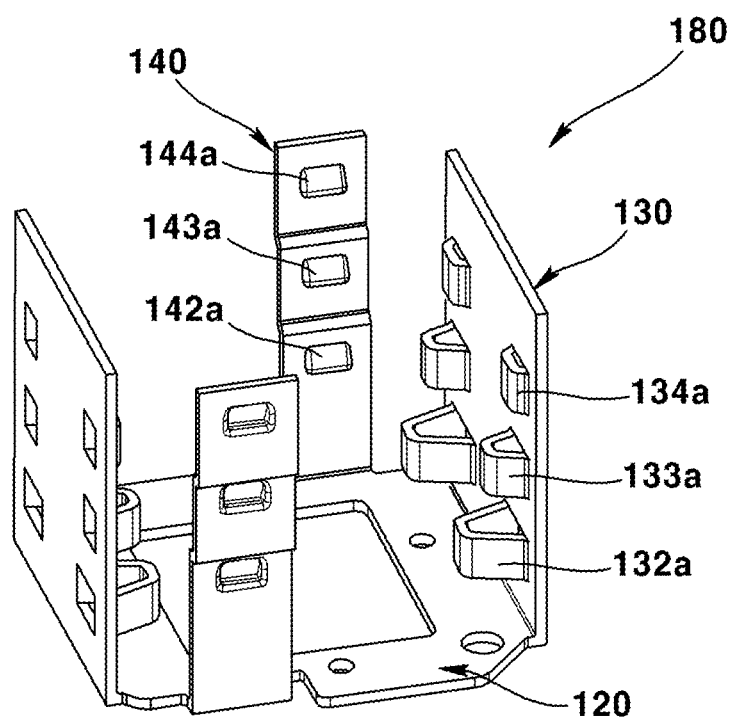
FIG. 5 is a perspective view illustrating a fixing unit according to a second exemplary embodiment of the present invention.

FIG. 5 is a perspective view illustrating a fixing unit according to a second exemplary embodiment of the present invention. The fixing unit is substantially same in terms of configuration as that illustrated in FIGS. 2 to 4 except for support part and the protrusions. Thus, redundant explanation to the same configurations will be omitted, and same reference numerals and nomenclatures will be provided to those as in FIGS. 2 and 4.

Referring to FIG. 5, the fixing unit (180) may include a base part (120), a first fixing part (130) and a second fixing part (140).

The first fixing part (130) may include support parts (132a,133a,134a) formed along a height direction relative to the base part (120).

Each of the support parts (132a,133a,134a) may be formed by cutting off a portion of first fixing part (130) and protruding the cut-off portion to an inner surface direction facing an outer surface of the first fixing part (130) from the outer surface of the first fixing part (130), and the support parts (132a,133a,134a) may support a lower surface of the second to fourth circuit boards (114,116,118).

The second fixing part (140) may include protrusions (142a,143a,144a) formed along a height direction relative to the base part (120).

Each of the protrusions (142a,143a,144a) may be formed by cutting off a portion of the second fixing part (140) and protruding the cut-off portion to an inner surface direction facing an outer surface from the outer surface of the second fixing part (140), and each of the protrusions (142a,143a, 144a) may contact an upper surface of second to fourth circuit boards (114,116,118).

Figure 6:
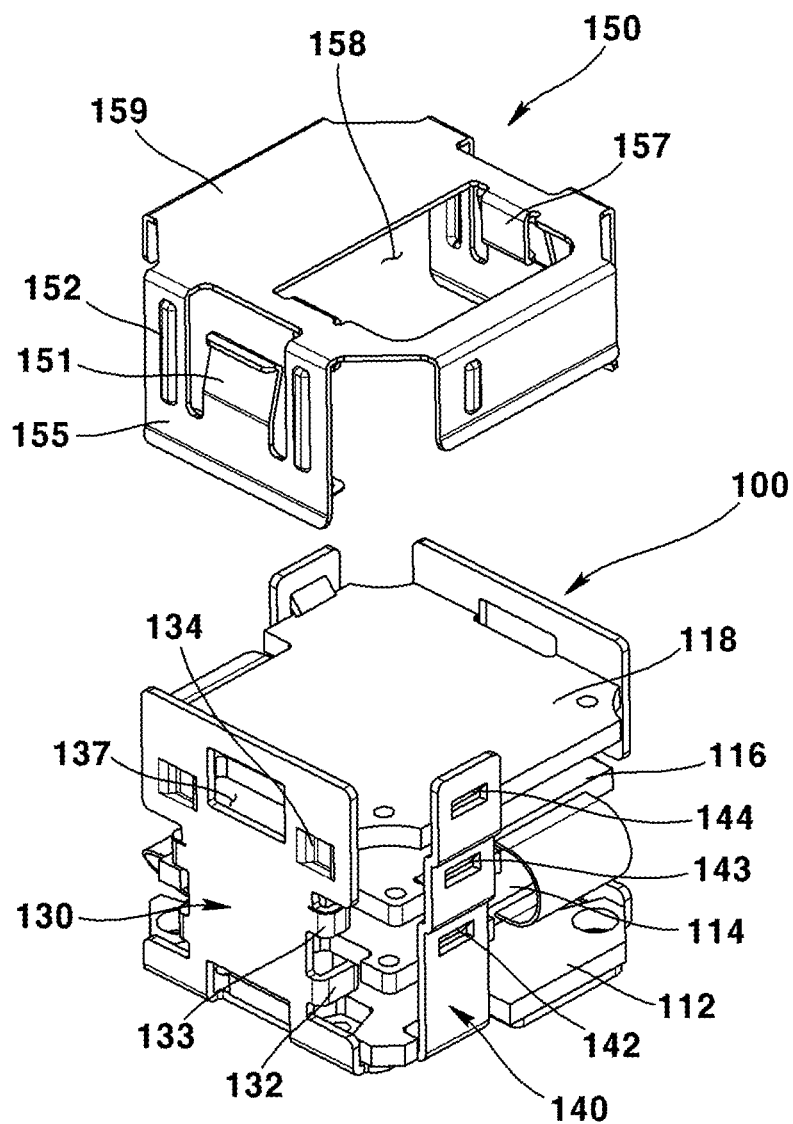
FIG. 6 is an exploded perspective view illustrating a fixing cap coupled to the fixing unit according to a first exemplary embodiment of present invention.
Figure 7:
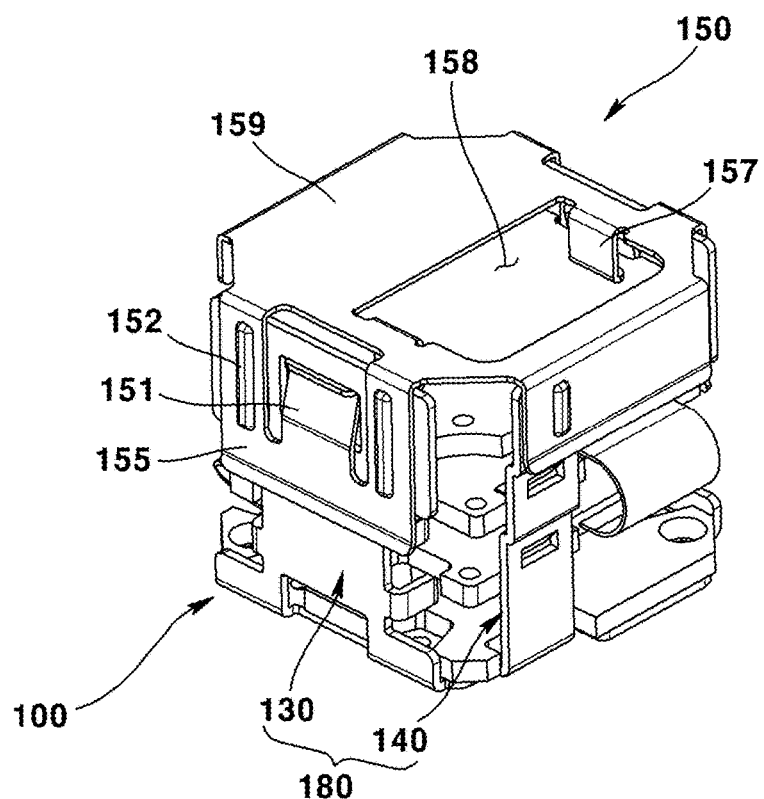
FIG. 7 is a coupled perspective view of FIG. 6.

FIG. 6 is an exploded perspective view illustrating a fixing cap coupled to the fixing unit according to a first exemplary embodiment of present invention, and FIG. 7 is a coupled perspective view of FIG. 6.

Referring to FIGS. 6 and 7, when the first and second fixing parts (130, 140) are opened up while the first to fourth circuit boards (112,114,116,118) are coupled to the first and second fixing parts (130, 140) of fixing unit (180), the first to fourth circuit boards (112,114,116,118) may be separated from the first and second fixing parts (130,140).

In order to inhibit this occurrence, the fixing unit may include a fixing cap (150). The fixing cap (150) may be coupled to the first and second fixing parts (130,140) to inhibit the fixing parts (130,140) from being opened. The fixing cap (150) may be manufactured with various materials such as metal materials having a strong rigidity and easy in processing, and synthetic resin materials easy in processing and formable of complex shapes. The fixing cap (150) may be formed in a shape of a lid, and the fixing cap may include a lateral wall (155) and an upper plate (159).

The upper plate (159) may be formed in a shape corresponding to the base part (120) of fixing unit (180), for example. When the base part (120) is formed with a shape of a square plate, for example, the upper plate (159) may be also formed in the shape corresponding to the base part (120), and the upper plate (159) in the exemplary embodiment of the present invention may be formed with a shape of a square plate.

The upper plate (159) may be formed with an opening (158) exposing a connector connected to the fourth circuit board (118) of fixing unit (180). Meantime, a separation prevention part (157) may be formed about the opening formed at the upper plate (159) that is bent inwardly of the upper plate (159) to contact or apply a pressure to an upper surface of the fourth circuit board (118) whereby the separation or deviation of the fourth circuit board (118) can be inhibited or restricted once again.

An edge of the upper plate (159) may be integrally formed with lateral walls (155), and the lateral walls (155) may be respectively contacted to an outsides of the first and second fixing parts (130,140) to inhibit the first and second fixing parts (130,140) from being opened.

Meantime, the lateral walls (155) may be formed with hitching parts (151) coupled to the first and second fixing parts (130,140), for example. The hitching part (151) may be formed by cutting off and bending a portion of lateral wall (155), and the first fixing part (130) corresponding to the hitching part (151) may be formed with a through hole (137) to be coupled to the first fixing part (130) by way of hook method.

The lateral wall (155) may be formed with at least one bending prevention rib (152) in order to inhibit the lateral wall (155) from being bent.

Figure 8:
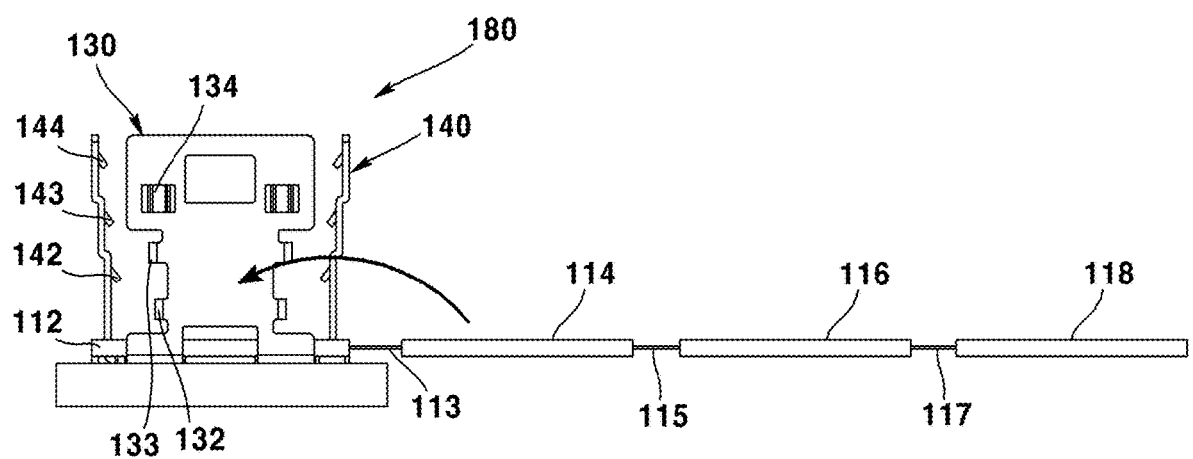
FIGS. 8 to 10 are drawings illustrating a sequence of assembling first to fourth circuit boards to first and second fixing parts of fixing unit according to a first exemplary embodiment of present invention.
Figure 9:
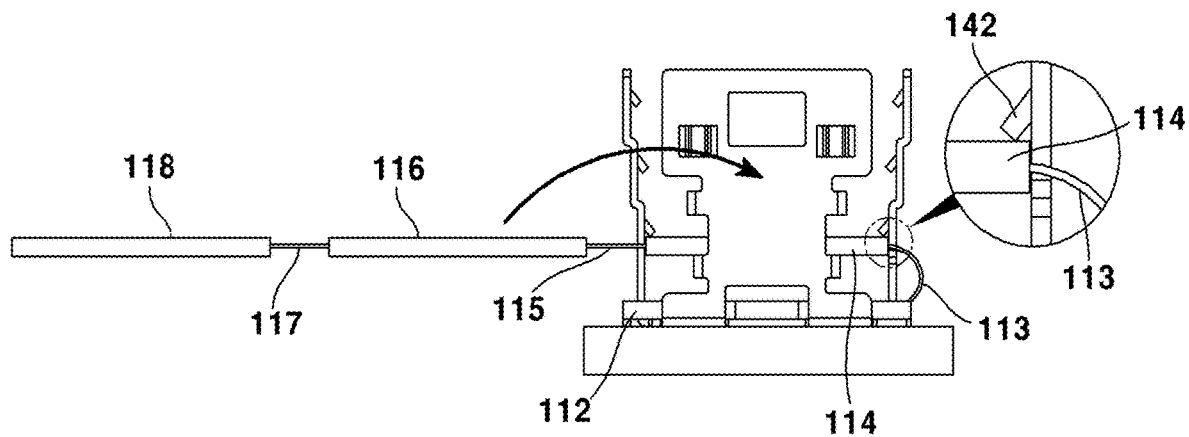
Figure 10:
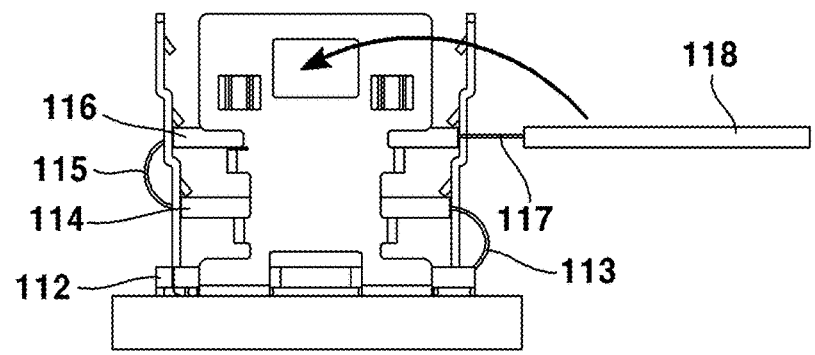

FIGS. 8 to 10 are drawings illustrating a sequence of assembling first to fourth circuit boards to first and second fixing parts of fixing unit according to a first exemplary embodiment of present invention.

Referring to FIG. 8, the base part (120) of fixing unit (180) may be fixed and coupled by the first circuit board (112).

Hereinafter, as illustrated in FIG. 9, the first and second fixing parts (130,140) may be such that the second circuit board is so coupled as to face the first circuit board, and as illustrated in FIG. 10, the first and second fixing parts (130,140) may be such that the third circuit board (116) is so coupled as to face the second circuit board (114).

Hereinafter, as illustrated in FIG. 3, the first and second fixing parts (130,140) may be such that the fourth circuit board (118) is so coupled as to face the third circuit board (116). Referring to FIG. 2 again, the device for fixing a camera module circuit board (100, "camera module circuit board fixing device", "device") including the fixing unit (180) explained through FIG. 3 may be coupled to an inside of housing (500), where the housing (500) may be coupled by a lens assembly (4000) coupled by the lens (300).

As explained in detail from the foregoing discussion, the device and the camera module according to the first and second exemplary embodiments of the present invention can inhibit an increased number of assembly processes, to reduce a manufacturing cost, to inhibit a decreased parts mounting area of circuit board and to inhibit bending of circuit board by securely fixing the circuit board inside a housing without using a coupling screw when the circuit board is fixed inside the housing.

Now, a camera module according to a third exemplary embodiment of the present invention will be described.

Figure 11:
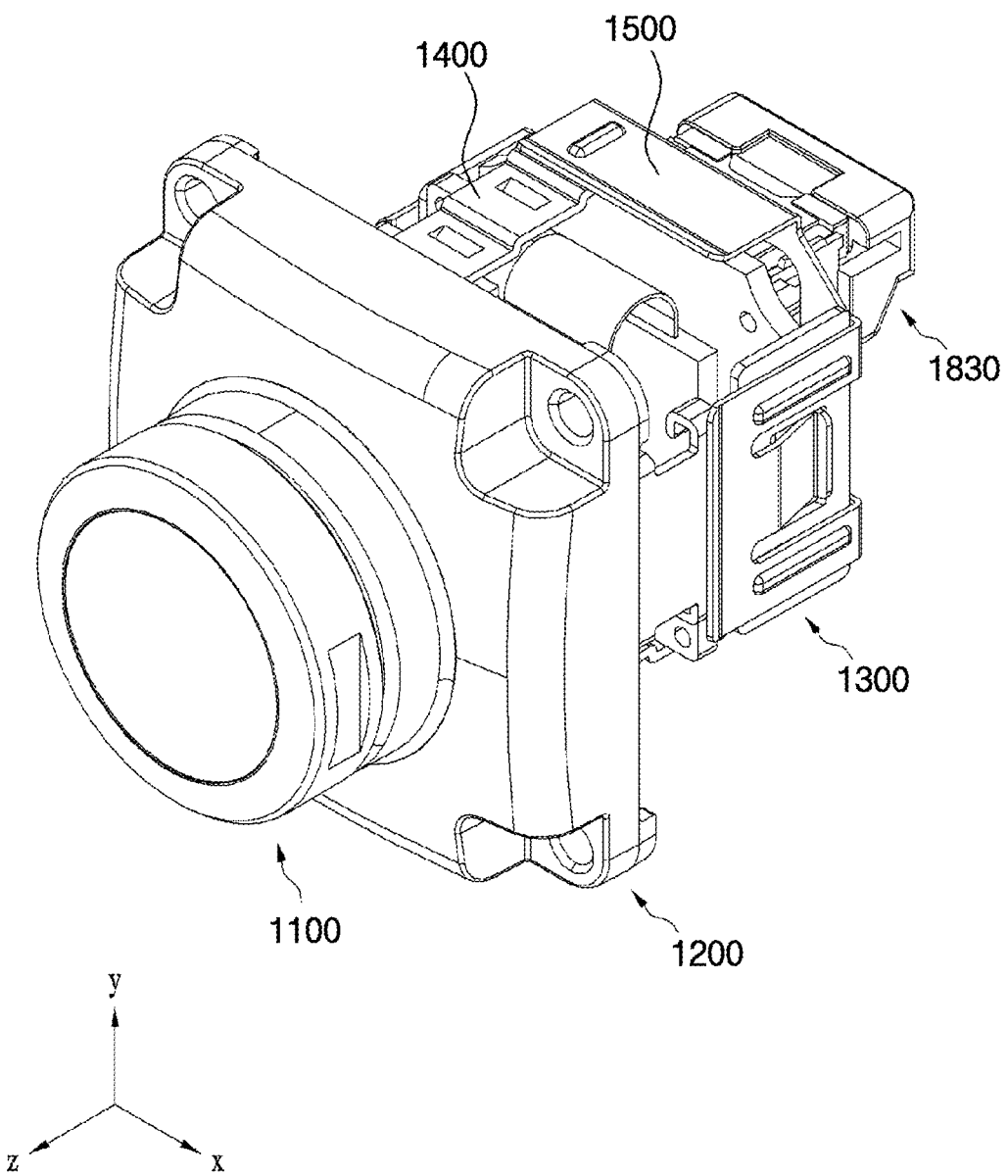
FIG. 11 is a perspective view illustrating a camera module according to a third exemplary embodiment of present invention.
Figure 12:
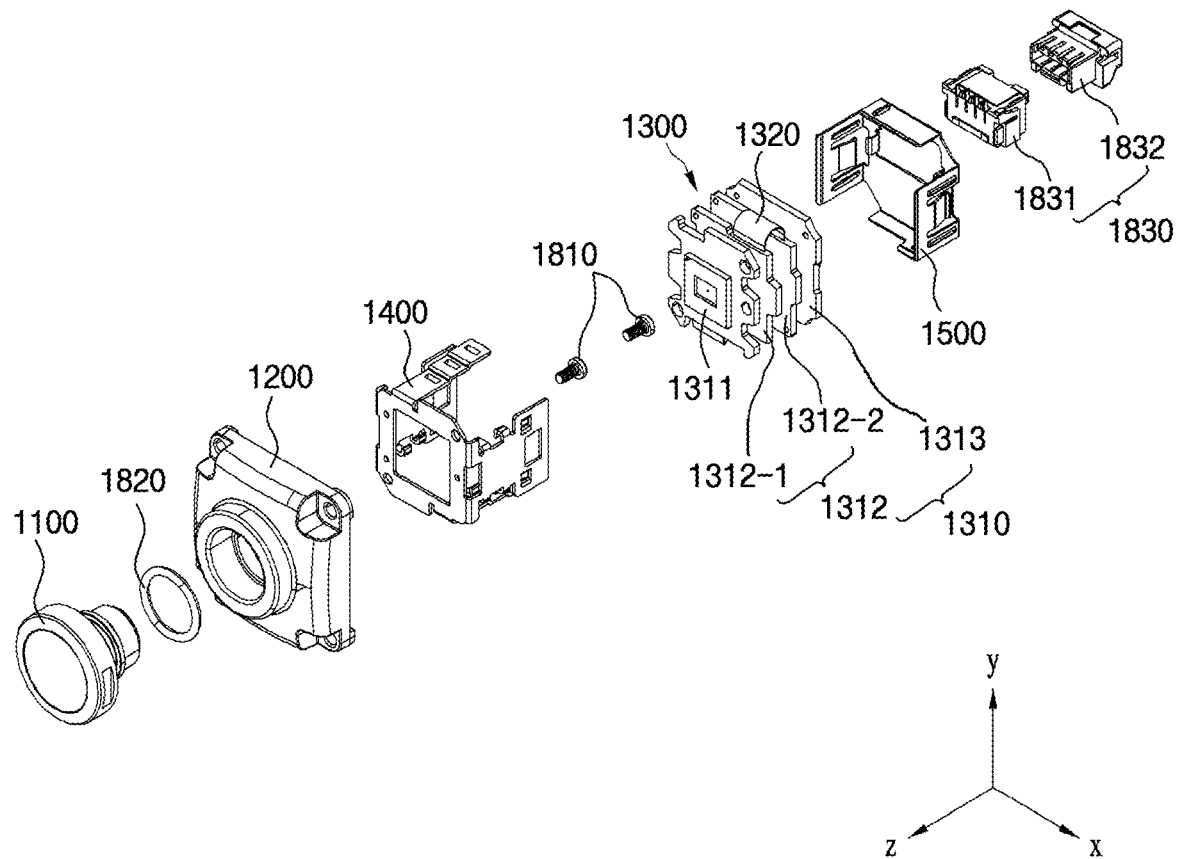
FIG. 12 is an exploded perspective view illustrating a camera module according to a third exemplary embodiment of present invention.
Figure 13:
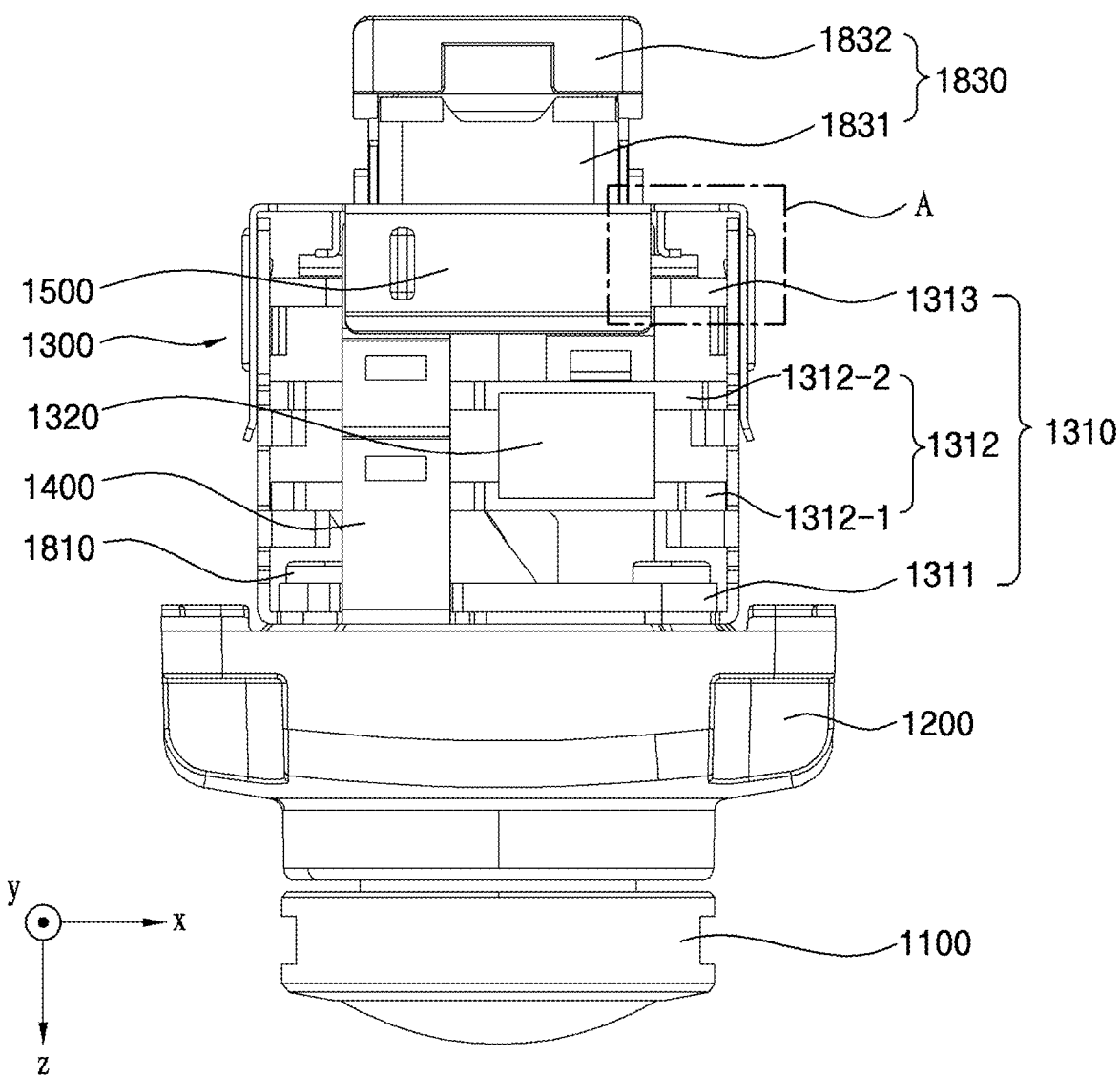
FIG. 13 is a front view illustrating a camera module according to a third exemplary embodiment of present invention.

FIG. 11 is a perspective view illustrating a camera module according to a third exemplary embodiment of present invention, FIG. 12 is an exploded perspective view illustrating a camera module according to a third exemplary embodiment of present invention, and FIG. 13 is a front view illustrating a camera module according to a third exemplary embodiment of present invention.

The camera module according the third exemplary embodiment of the present invention may include a lens part (1100), a front body (1200), a board part (1300), a first fence (1400), a second fence (1500), an image sensor (1700), a fastening device (1810), a sealing member (1820) and a cable connector (1830).

The lens part (1100) may be an area where an outside light is incident, and may include a lens barrel mounted with at least one lens. At this time, the lens barrel may be formed with a single lens, but may be formed with a plurality of lenses each lens aligned to an optical axis direction, that is, a first direction. In another exemplary embodiment, the lens barrel may be such that one lens or a plurality of lenses is directly coupled to the front body (1200).

Furthermore, the lens part (1100) may be coupled with the front body (1200) by way of methods such as screw-connection and press-fit, and a sealing member (1820) may be provided to inhibit foreign objects such as moisture and dust from being introduced in the camera module through a gap formed between the lens part (1100) and the front body (1200).

The sealing member (1820), as illustrated in FIG. 12, may be disposed at a coupled area between the lens part (1100) and the front body (1200), and may be disposed in the shape of an O-ring, for example.

The front body (1200) may be disposed in a shape of a hollow hole accommodating the lens part (1100) into an inner space. The front body (1200) may be mounted at a front side with the lens part (1100). To this end, the front body (1200) may be formed with a hollow hole mounted with the lens part (1100).

The front body (1200) may be coupled with a housing (not shown). The coupling between the front body (1200) and the housing may be implemented by a coupling device (not shown), for example. Toward this end, as illustrated in FIGS. 11 and 12, an corner area of front body (1200) may be formed with a through hole into which the coupling device is inserted.

However, the above explained discussion is merely an exemplary embodiment, and in another exemplary embodiment, the front body (1200) and the housing may be coupled with methods such as adhesion and press-fit without recourse to using a coupling device.

The cable connector (1830) may function to connect the board part (1300) to an outside cable. The camera module may receive a power from outside through an outside cable (not shown) electrically connected to the cable connector (1830) or may exchange an electrical signal with an outside device.

The cable connector (1830) may include a first connector (1831) and a second connector (1832). The first connector (1831) may be coupled with the board part (1300) and the second connector (1832) may be coupled with the first connector (1831) and the outside cable.

As illustrated in FIG. 13, the first connector (1831) may be coupled with a third board (1313) that is disposed at a rearmost area of the board part (1300), for example, and the second connector (1832) may be coupled with the first connector (1831), and the outside cable may be coupled with the second connector (1832). Because of this structure, the board part (1300) and the outside cable can be electrically and mutually connected.

The board part (1300) may be disposed at a rear side of front body (1200), and may be formed with a plurality of PCBs (1310). The board part (1300) may include a PCB (1310) and a connector (1320).

The PCBs (1310), as illustrated in FIG. 12, may be disposed in plural number to an optical axis direction, each spaced apart from the other PCB. The PCB (1310) may be disposed to face the lens part (1100) in a plural number. Although FIG. 12 has illustrated four PCBs (1310) as an exemplary embodiment, more than four PCBs or fewer than four PCBs may be disposed.

Hereinafter, the board part (1300) including the PCB (1310) according to the third exemplary embodiment as illustrated in FIGS. 11 to 13 will be described. The PCB (1310) may include a first board (1311), a second board (1312) and a third board (1313).

The first board (1311) may be so disposed as to face the lens part (1100). The third board (1313) may be so disposed as to be spaced apart from the first board (1311) to the optical axis direction. The second board (1312) may be so disposed between the first board (1311) and the third board (1313) as to be spaced apart from the first board (1311) and the third board (1313).

At this time, the second board (1312) may include a 2-1 board (1312-1) disposed near to the first board (1311) and a 2-2 board (1312-2) disposed near to the third board (1313). However, the present invention is not limited thereto, and the second board (1312) may be formed with one board, or with more than three (3) boards each arranged to an optical axis direction.

The first board (1311) may face the lens part (1100), but may be disposed adjacent to the lens part (1100), and may be mounted with an image sensor (1700) at a surface opposite to the lens part (1100), i.e., a front surface, and may be formed with electronic circuits formed with various circuit devices.

The image sensor (1700) may sense a light incident on through the lens part (1100), where the first board (1311) may function to convert the sensed light to an electric signal and transmit the converted electric signal to an outside image storage or an image reproduction device. However, the conversion of sensed image to an electric signal may be also performed by other boards.

The second board (1312) including the 2-1 board (1312-1) and the 2-2 board (1312-2) may be interposed between the first board (1311) and the third board (1313), where the first board (1311) and the third board (1313) may be electrically connected to form an electromagnetic circuit.

The 2-1 board (1312-1) and the 2-2 board (1312-2) may function to be an electric path supplying a power to the first board (1311), and may function to transmit the electric signal relative to the sensed image transmitted from the first board (1311) to an outside image storage or an image reproduction device.

For example, the 2-1 board (1312-1) and/or the 2-2 board (1312-2) may function to transmit the converted electric signal to an outside storage or an image reproduction device by converting the sensed image transmitted from the first board (1311) to an electric signal, or may function to rectify a power inputted from the third board (1313) and transmit the rectified power to the first board (1311).

That is, the 2-1 board (1312-1) and/or the 2-2 board (1312-2) may be interposed between the first board (1311) and the third board (1313) to partially perform the role of the first board (1311) and the third board (1313).

The third board (1313) may be disposed at a rear side of second board (1312), electrically connected to the second board (1312) and may form an electromagnetic circuit. As discussed in the foregoing, the third board (1313) may be electrically connected to the cable connector (1830) and an outside cable.

The third board (1313) may largely function to transmit a power to the first board (1311) and the second board (1312) by receiving from outside the power necessary for operation of camera module, and to transmit an electric signal relative to the sensed image transmitted from the first board (1311) and the second board (1312) to an outside image storage or an image reproduction device.

Hence, the third board (1313) may be mounted with devices such as a condenser, a rectifier and a transformer in order to supply a power having an adequate voltage and current necessary for operation of camera module. Furthermore, the third board (1313) may be coupled by the cable connector (1830) for an electric connection with an outside image storage, an image reproduction device and a camera module controller.

The connector (1320) may electrically connect the plurality of PCBs and may be formed with a flexible material. The connector (1320) may function to electrically connect the plurality of PCBs (1310), that is, the first board (1311), the 2-1 board (1312-1), the 2-2 board (1312-2) and the third board (1313) respectively. The connector (1320) may be formed with one fewer number than that of the PCBs (1310) because the connector (1320) respectively and electrically connects each board.

Figure 17:
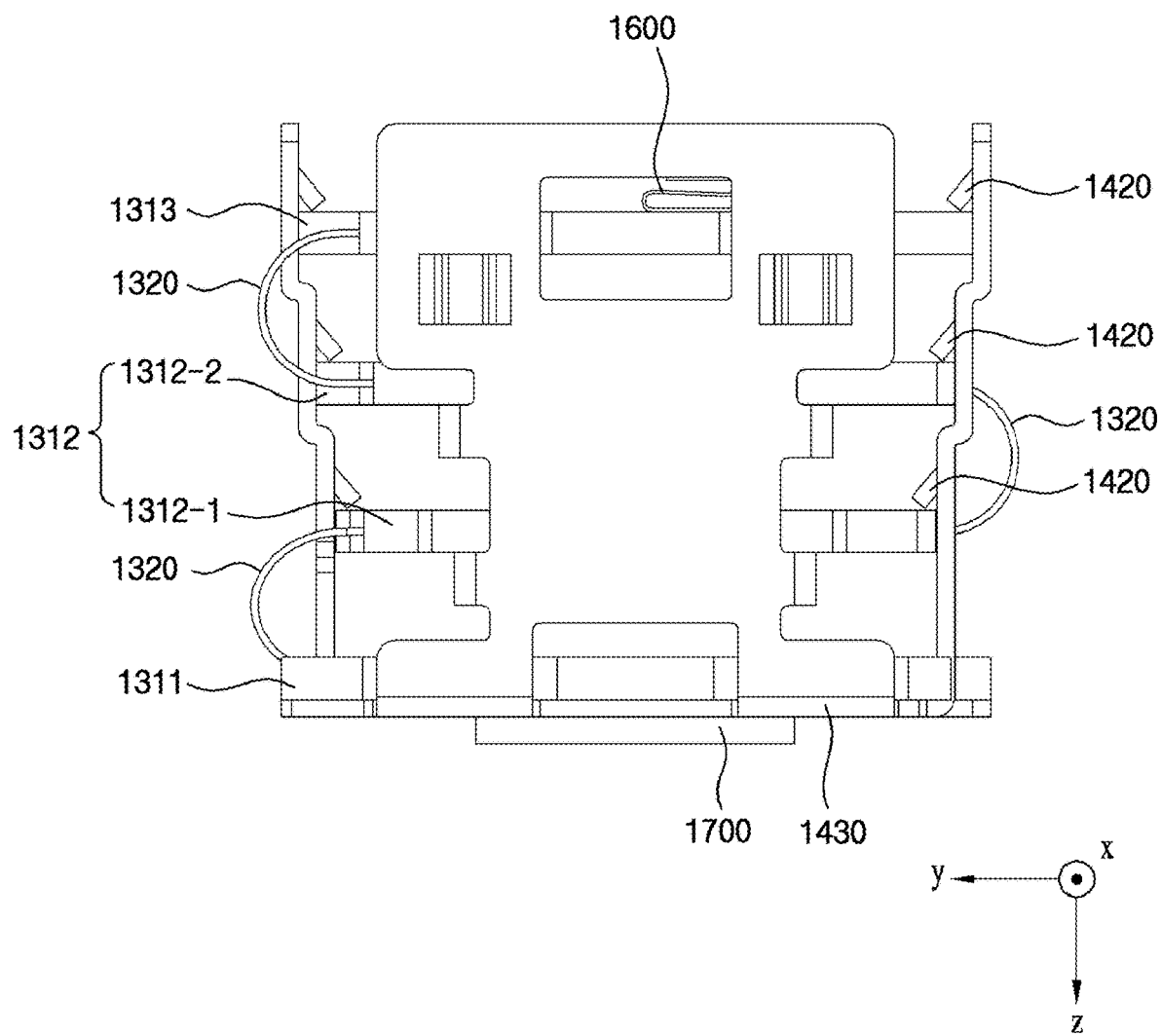
FIG. 17 is a drawing illustrating FIG. 16 rotated about a z axis.

In the third exemplary embodiment, and referring to FIG. 17, the PCBs (1310) may include a total of four boards of a first board (1311), a 2-1 board (1312-1), a 2-2 board (1312-2) and a third board (1313), such that the connector (1320) may be formed with three, one number fewer than the PCB.

Although FIGS. 12 and 17 has illustrated that one connector (1320) connecting each board in the exemplary embodiment is formed at each lateral surface of each board, the present invention is not limited thereto, and the number and arrangement position of connector may be selected in consideration of circuit structure of each board and an overall structure of camera module.

It would be appropriate that the connector (1320) be formed with soft and flexible material in consideration of ease in coupling works with each board, and necessity of absorbing shocks and vibrations least the camera module be damaged by the shocks and vibrations applied from outside of the camera module. Thus, the connector (1320) may be formed with a flexible circuit board. However, the present invention is not limited thereto, and the connector (1320) may be formed with a rigid material as long as the rigid material is robust to shocks and vibrations, and may be formed by using a bundle of wires.

Furthermore, a soldering and an adhesion method using an electrically-conductive adhesive may be used to couple the connector (1320) with each board. The connector (1320) may function a role of a B2B (board to board) connector (1320) electrically connecting each board.

The first fence (400) may function to mutually space apart a plurality of PCBs (310) to an optical axis direction by being coupled to the board part (300). The first fence (400) will be described in detail in the following using the accompanying drawings.

Figure 14:
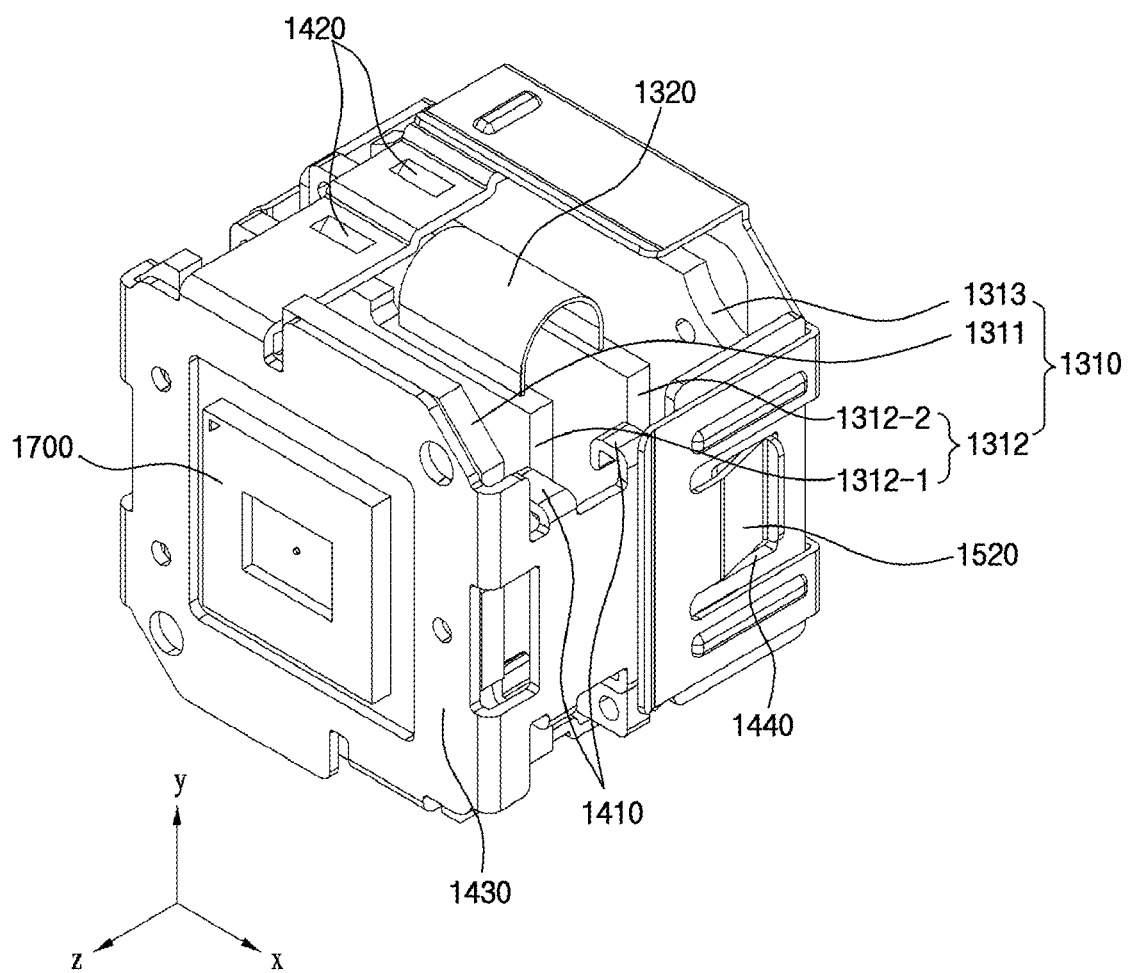
FIG. 14 is a perspective view illustrating a portion of a camera module according to a third exemplary embodiment of present invention.
Figure 15:
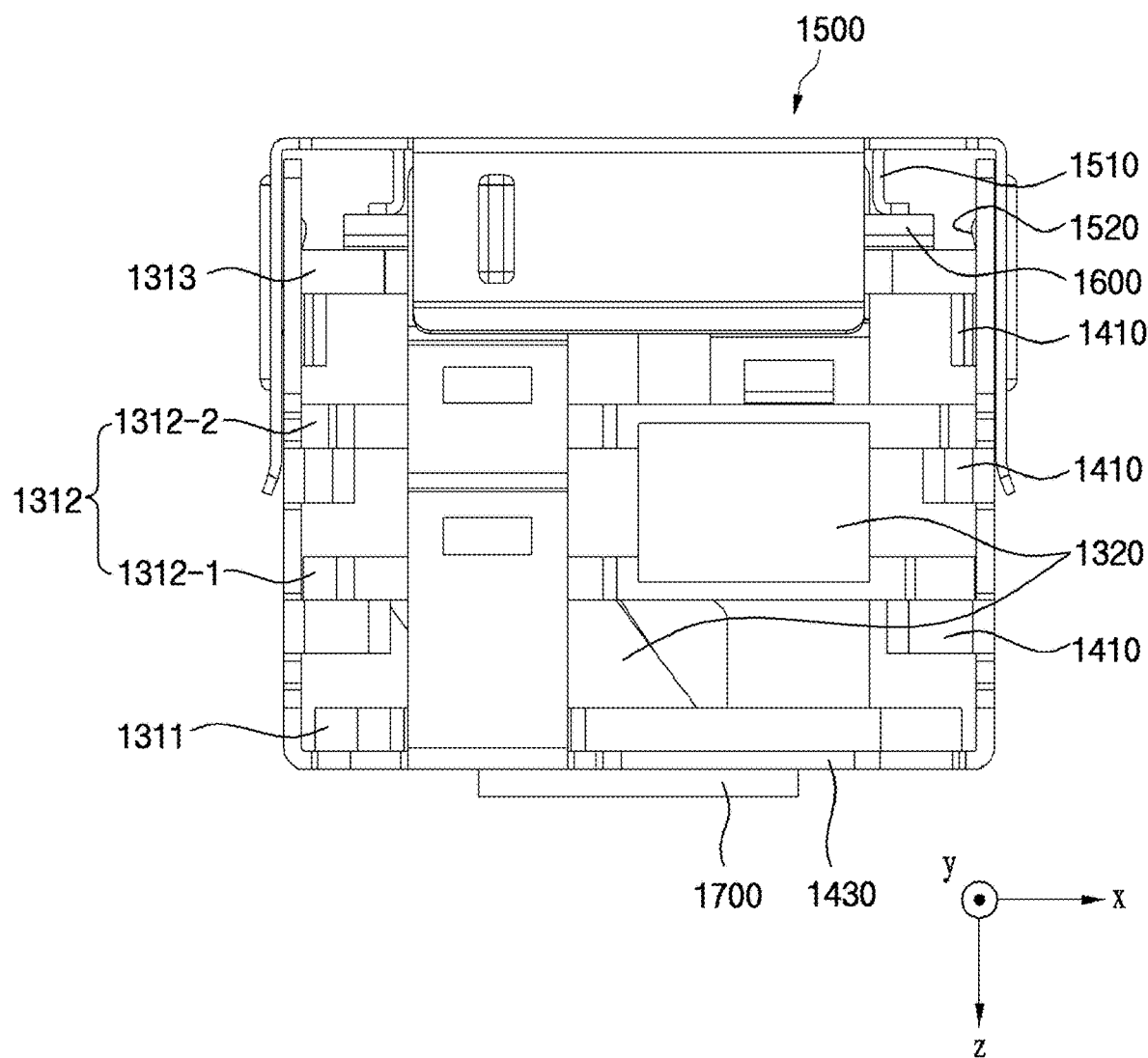
FIG. 15 is a front view of FIG. 14.

FIG. 14 is a perspective view illustrating a portion of a camera module according to a third exemplary embodiment of present invention, and FIG. 15 is a front view of FIG. 14.

The second fence (1500) may be coupled with the first fence (1400) at a rear surface of the first fence, and may function to ground the board part (1300) by being electrically connected with the board part (1300).

When a power is supplied to the camera module from an outside power source, the camera module may be generated with a static electricity. Particularly, the static electricity generated by the board part (1300) may affect an ill effect to the performance of camera module.

For example, the static electricity generated by the board part (1300) may generate an electromagnetic noise, and this noise may be a cause of moving a photographed image or degrading an image quality, such that the noise may deteriorate the EMC (Electro Magnetic Compatibility) of camera module.

In order to solve the aforementioned problem, there is a need of the board part (1300) being grounded to remove or reduce the static electricity generated from the board part (1300), where the second fence (1500) may function as a grounding part in the third exemplary embodiment.

In order to allow the second fence (1500) to function as a grounding part, the board part (1300) and the second fence (500) must be electrically connected, and this electrical connected structure will be described in detail in the following using the accompanying drawings.

As illustrated in FIG. 15, the second fence (1500) may surround the first fence (1400) at a rear side of the first fence (1400), and may be therefore coupled with the first fence (1400). At this time, the second fence (1500) may be attachably and detachably coupled with the first fence (1400).

The second fence (1500) may be formed with a hook (1520) in order to allow being attachably and detachably coupled with the first fence (1400). Furthermore, the first fence (1400) may be formed at an area corresponding to that of the hook (1520) with a through hole (1440) coupled by the hook (1520).

The hook (1520) may be elastically deformable such that the hook (1520) may be coupled or detached from the through hole (1440) while being elastically deformed, whereby the second fence (1500) may be attachably and detachably coupled with the first fence (1400).

As illustrated in FIG. 15, the camera module according to the present exemplary embodiment may further include a finger (1600). The finger (1600) may function to electrically connect the board part (300) and the second fence (1500).

For example, the finger (1600) may electrically connect the second fence (1500) and the third board (1313). The finger (1600) may be coupled with the third board (1313), and the second fence (1500) may be formed at an area corresponding to that of the finger (1600) with a pressure part (1510) applying a pressure to the finger (1600).

Because of this structure, the pressure part (1510) applies a pressure to the finger (1600), whereby the pressure part (1510) and the finger (1600) are mutually contacted, and as a result, the second fence (1500) and the board part (1300) including the third board (1313) can be mutually and electrically contacted. The detailed structure of the finger (1600) and the pressure part (1510) will be explained in detail in the following with reference to the accompanying drawings.

Meantime, the second fence (1500) is adequate to be formed with a conductive material, e.g., an electrically conductive metal material to allow a static electricity generated from the board part (1300) to flow to the second fence (1500) by being electrically connected to the third board (1313).

Figure 16:
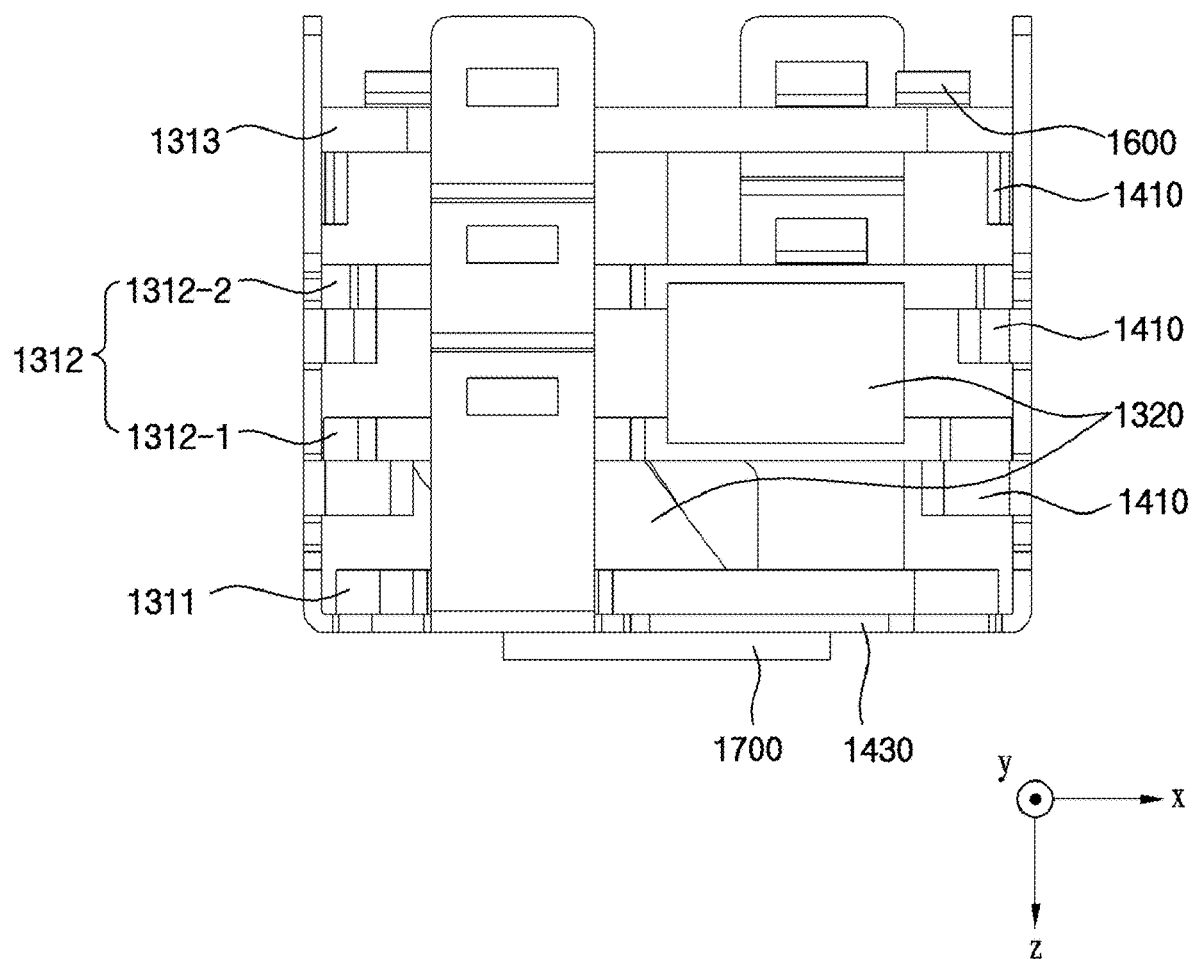
FIG. 16 is a drawing illustrating a camera module of FIG. 15 removed of second fence according to a third exemplary embodiment of present invention.
Figure 18:
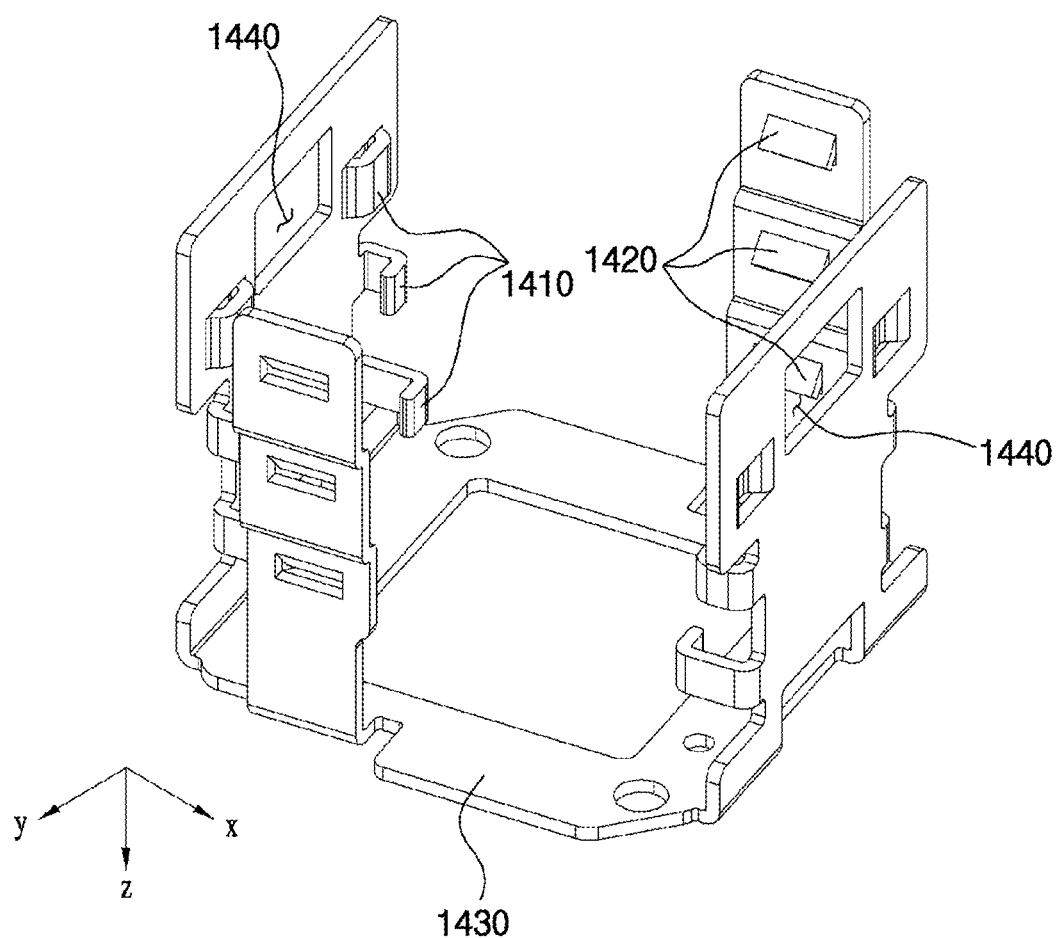
FIG. 18 is a perspective view illustrating a first fence according to a third exemplary embodiment of present invention.

FIG. 16 is a drawing illustrating a camera module of FIG. 15 removed of second fence (1500) according to a third exemplary embodiment of present invention, FIG. 17 is a drawing illustrating FIG. 16 rotated about a z axis, and FIG. 18 is a perspective view illustrating a first fence (1400) according to a third exemplary embodiment of present invention.

The first fence (1400) may be coupled with the board part (1300) to function to space a plurality of PCBs apart to an optical axis direction, and may include a body coupling part (1430), a first protrusion (1410) and a second protrusion (1420).

The body coupling part (1430) may be so formed as to be coupled with the front body (1200) at one side of first fence, i.e., a front side of the first fence. At this time, the body coupling part (1430) may be interposed between the front body (1200) and the first board (1311) to be coupled to the front body (1200) and the first board (1311).

At this time, the front body (1200), the body coupling part (1430) and the first board (1311) may be mutually coupled by a fastening device (1810) (see FIGS. 12 and 13). Because of this structure, the board part (1300) including the first board (1311) may be coupled with the front body (1200) by the first fence (1400).

At this time, the body coupling part (1430) may be formed with a through hole to allow the image sensor (1700) mounted at a front surface of the first board (1311) to mutually face the lens part (1100), as illustrated in FIG. 18.

The first protrusion (1410) may support a front surface, e.g., one surface of the PCB (1310). The second protrusion (1420) may support a rear surface, e.g., the other surface of PCB (1310). Thus, the first and second protrusions (1410, 1420) may be so formed as to be spaced apart to an optical axis direction, and this discrete distance may correspond to a thickness of each PCB (1310), e.g., the thickness of second board (1312), and the third board (1313).

The second board (1312) and the third board (1313) may be coupled with the first fence (1400) by the first protrusion (1410) and the second protrusion (1420), and may be so disposed as to be spaced apart to an optical axis direction.

That is, the second board (1312) and the third board (1313) may be inserted between the first and second protrusions (1410, 1420) to be coupled with the first fence (1400). Meanwhile, the first board (1311) may be coupled to the body coupling part (1430) by the fastening device (1810) to be inhibited from being inserted between the first and second protrusions (1410, 1420), as mentioned before.

Because of this structure, the first and second protrusions (1410, 1420) at the first fence (1400) in the present exemplary embodiment may be disposed at three areas each spaced apart to an optical axis direction. This is because the 2-1 board (1312-1), the 2-2 board (1312-2) and the third board (1313) are inserted between the first and second protrusions (1410, 1420) in the third exemplary embodiment.

The mutually discrete position of the first board (1311), the 2-1 board (1312-2) and the third board (1313) to the optical axis direction may be determined by each discrete position to the optical axis direction of the first and second protrusions (1410, 1420).

In the third exemplary embodiment, use of first fence (1400) including the body coupling part (1430), the first protrusion (1410) and the second protrusion (1420) may accomplish an effect of easily aligning at a predetermined gap to an optical axis direction the plurality of PCBs (1310) mounted on the board part (1300) of camera module.

Furthermore, the first fence (1400) may be so formed as to surround the board part (1300), and therefore may function to partially shield the electromagnetic wave generated from the board part (1300).

Figure 19:
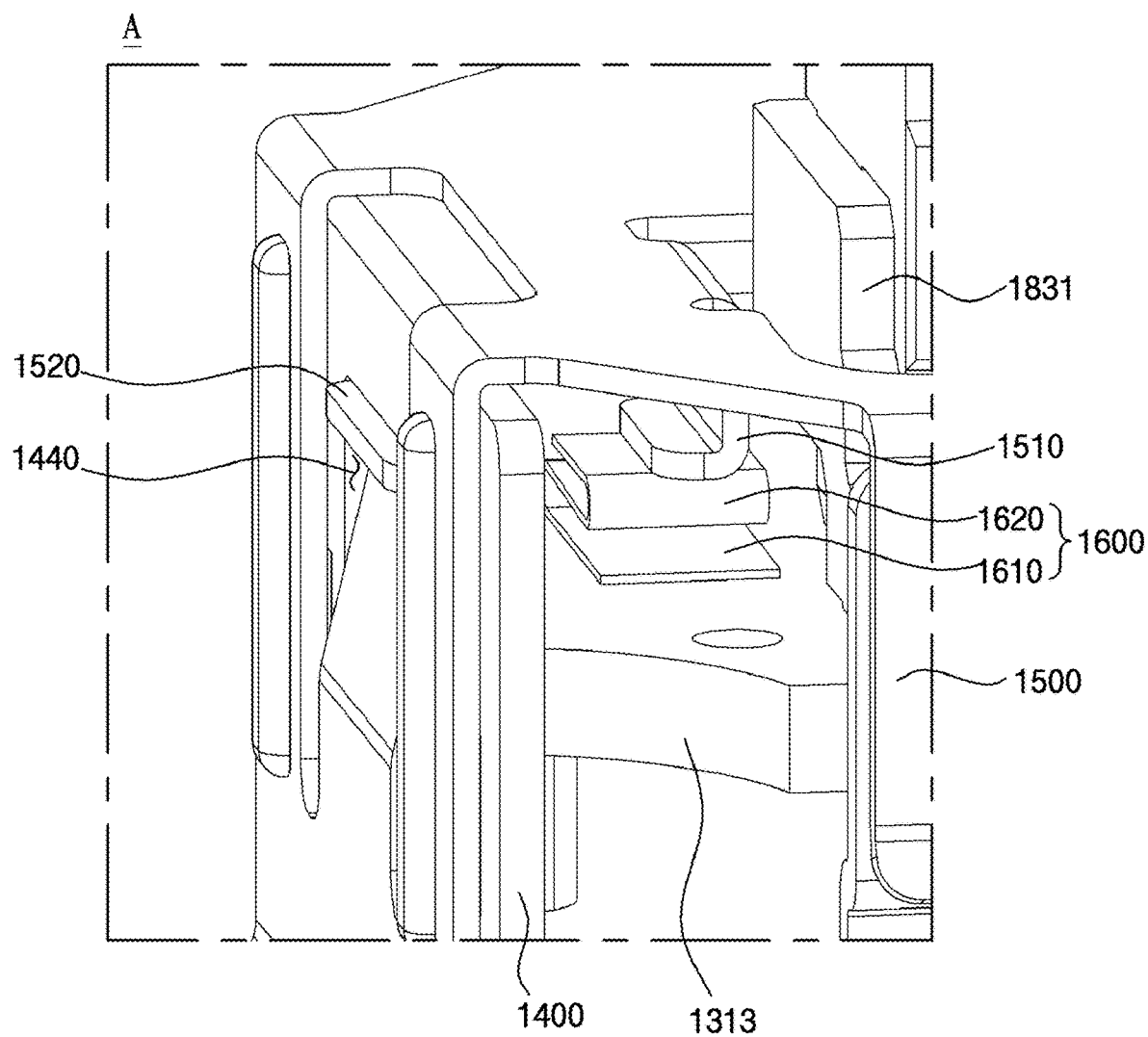
FIG. 19 is a partial perspective view illustrating 'A' portion of FIG. 13.

FIG. 19 is a partial perspective view illustrating 'A' portion of FIG. 13.

The finger (1600) may include a board coupling part (1610) and an elastic deformation part (1620). The board coupling part (1610) may be coupled with the third board (1313). At this time, the board coupling part (1610) and the third board (1313) may be mutually coupled by using a soldering and a conductive adhesive. The elastic deformation part (1620) may be elastically deformed by being extensively formed from the board coupling part (1610).

The second fence (1500) and the third board (1313) can be mutually and electrically connected by the second fence (1500) applying a pressure to the elastic deformation part (1620). At this time, the second fence (1500) may include a pressure part (1510) applying a pressure to the finger (1600) by being protrusively formed to a direction of the board part (1300).

When the pressure part (1510) contacts the elastic deformation part (1620) to apply a pressure to the elastic deformation part (1620), the elastic deformation part (1620) is generated with an elastic deformation, whereby the pressure part (1510) and the elastic deformation part (1620) can be more securely and electrically connected to thereby inhibit an electrical disconnection between the pressure part (1510) and the elastic deformation part (1620).

That is, when the second fence (1500) is coupled with the first fence (1400), a distal end of the pressure part (1510) is disposed at a position lower than an upper surface of the elastic deformation part (1620), whereby the elastic deformation part (1620) may be generated with deformation, and simultaneously may generate a definite contact with the pressure part (1510), and as a result, the pressure part (1510) and the elastic deformation part can be definitely and electrically connected without the electrical disconnection.

When the pressure part (1510) and the elastic deformation part (1620) are electrically connected, the second fence (1500) including the pressure part (1510), the finger including the elastic deformation part (1620) and the board part (1300) including the finger (1600) can be electrically connected.

As a result, the static electricity generated from the board part (1300) can flow to the electrically connected second fence (1500), and the second fence (1500) can function as a grounding part, whereby the static electricity generated from the board part (1300) can be removed or significantly reduced.

In the third exemplary embodiment, the board part (1300) and the second fence (1500) are electrically connected to allow the static electricity generated from the board part (1300) to flow to the second fence (1500), and the second fence (1500) may function as a grounding part, whereby there may be an effect of the static electricity generated from the board part (1300) being removed or significantly reduced.

Furthermore, the removal or definite reduction of static electricity generated from the board part (1300) may produce an effect of inhibiting the degraded image quality of camera module and deterioration of EMC (Electro Magnetic Compatibility).

Figure 20:
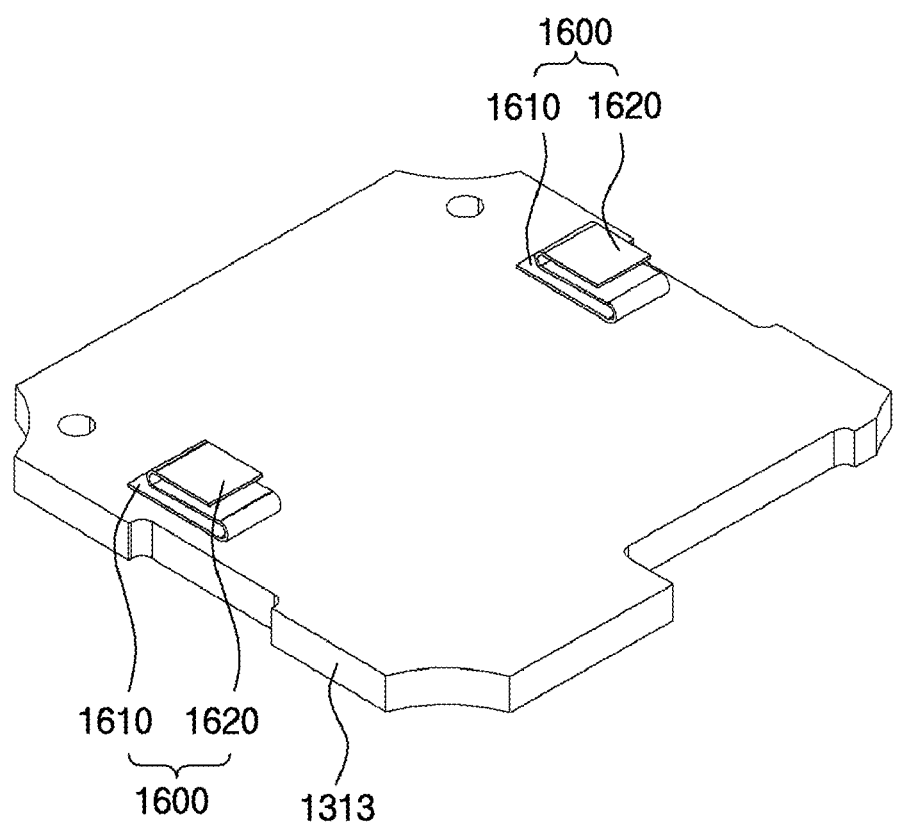
FIG. 20 is a perspective view illustrating a third board and a finger according to a third exemplary embodiment of present invention.
Figure 21:
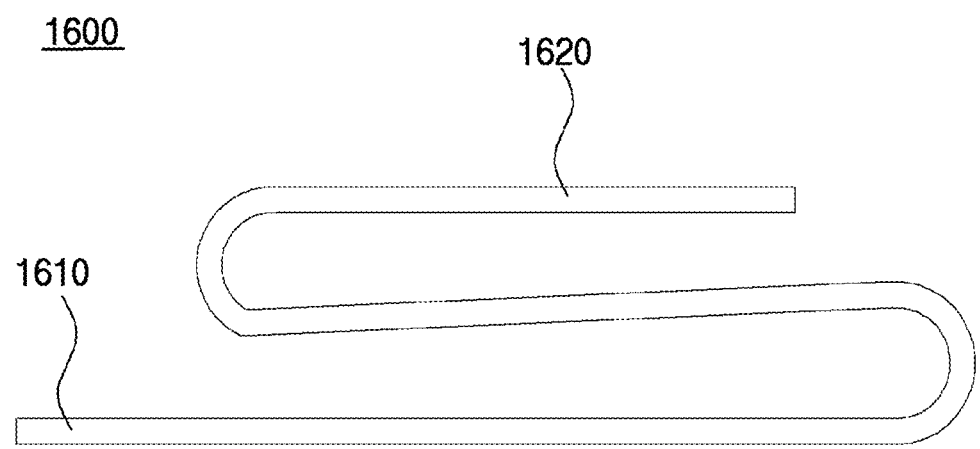
FIG. 21 is a lateral view illustrating a finger according to a third exemplary embodiment of present invention.

FIG. 20 is a perspective view illustrating a third board (1313) and a finger (1600) according to a third exemplary embodiment of present invention, and FIG. 21 is a lateral view illustrating a finger (1600) according to a third exemplary embodiment of present invention.

As illustrated in FIG. 20, the finger (1600) may be coupled with a rear surface of third board (1313) disposed at a rearmost side in the PCBs (1310). Furthermore, the finger (1600) may be disposed at an area opposite to the pressure part (1510) formed at the second fence (1500) to an optical axis direction.

Furthermore, the finger (1600) may be formed in the same number as that of the pressure part (1510). Although FIG. 20 has illustrated two fingers (1600), the present invention is not limited thereto, and one finger or more than three fingers (1600) may be also formed.

In addition, the position of finger (1600) is not particularly restricted, and the position and the number of finger (1600) may be adequately selected in consideration of detailed structure or an overall structure of camera module. At this time, the pressure part (1510) may be formed in correspondence to the position and the number of finger (1600).

As illustrated in FIG. 21, the elastic deformation part (1620) of finger (1600) may take an S shape when viewed from a lateral surface. However, this is a mere exemplary embodiment, and the elastic deformation part (1620) may take any shape as long as the elastic deformation part (1620) is elastically deformed by the pressure part (1510) to allow maintaining a definite electrical and mechanical contact between the elastic deformation part (1620) and the pressure part (1510).

Meantime, the finger (1600) may be adequate to be formed with a material excellent in wear resistance, fatigue strength, elastic limitation and electrical conductivity. Thus, the finger (1600) may be formed with a beryllium copper, for example.

Although only several cases have been described with reference to exemplary embodiments as noted above, various types of exemplary embodiments may be also available. The technical contents of aforesaid exemplary embodiments may be combined in various manners unless the technical contents are compatible, through which the technical contents may be realized in new exemplary embodiments.

The invention claimed is:

1. A camera module, comprising:
  a housing;
  a fixing unit disposed in the housing;
  a printed circuit board (PCB) coupled to the fixing unit; and
  a lens disposed at a position corresponding to an image sensor,
  wherein fixing unit comprises a first fixing part extending in a first direction parallel to an optical axis of the lens, and a second fixing part extending in the first direction,
  wherein the first fixing part comprises a first body part, and a first protruding part inwardly protruding from the first body part, wherein the second fixing part comprises a second body part, and a second protruding part inwardly protruding from the second body part, wherein the PCB is disposed between the first protruding part and the second protruding part, wherein the first protruding part is contacted with a first surface of the PCB, wherein the second protruding part is contacted with a second surface of the PCB opposite to the first surface of the PCB, wherein the first protruding part comprises a first bent portion bent toward the first surface of the PCB, wherein the second protruding part comprises a second bent portion bent toward the second surface of the PCB, and wherein respective ends of the first protruding part and the second protruding part are disposed further inward than is an outer edge of the PCB.

2. The camera module of claim 1, wherein the first protruding part is formed by inwardly bending from a lateral surface of the first body part of the first fixing part.

3. The camera module of claim 1, wherein the first protruding part comprises a first portion extending in a second direction perpendicular to the first direction from a lateral surface of the first body part of the first fixing part, a second portion extending in a third direction perpendicular to the first direction and the second direction from the first portion, and a third portion connecting the first portion and the second portion, and wherein at least a portion of the third portion comprises a curved surface.

4. The camera module of claim 1, wherein the second protruding part comprises a cutting area that cuts at least a portion of the second body part of the second fixing part, and wherein the second protrusion part of the second fixing part is formed by protruding inwardly from the cutting area.

5. The camera module of claim 1, wherein the second protruding part of the second fixing part comprises a portion disposed obliquely with respect to the second body part of the second fixing part.

6. The camera module of claim 1, wherein the fixing unit comprises a base part on which one end of the first fixing part and one end of the second fixing part are disposed, wherein the base part comprises an opening, wherein a connector is passed through the opening of the base part, wherein the base part comprises first and second lateral surfaces spaced apart from each other, and third and fourth lateral surfaces spaced apart from each other, wherein the first fixing part is formed on the first lateral surface of the base part, and wherein the second fixing part is formed on the third lateral surface of the base part.

7. The camera module of claim 6, wherein the PCB comprises a plurality of PCBs, wherein the plurality of PCBs comprises a first PCB, and a second PCB coupled to the fixing unit and electrically connected with the first PCB, wherein the second PCB is spaced apart from the first PCB, wherein the second fixing part is spaced apart from the first fixing part, wherein the image sensor is disposed on the first PCB, and wherein the connector is coupled to the first PCB or the second PCB.

8. The camera module of claim 1, wherein the first protruding part of the first fixing part is disposed on a position higher than a position of the second protruding part of the second fixing part.

9. The camera module of claim 1, wherein the fixing unit comprises a base part on which one end of the first fixing part and one end of the second fixing part are disposed, and wherein the first fixing part is extensively disposed from a corner area mutually opposite to the base part, and the first protruding part of first fixing part is formed by bending an area protruded from a lateral surface of the first body part of the first fixing part.

10. The camera module of claim 9, wherein the first protruding part comprises a plurality of first protruding parts, and wherein a protruding length of the plurality of first protruding parts of the first fixing part is decreased while being distanced from the base part.

11. The camera module of claim 1, wherein the first protrusion part and the second protrusion part inhibit a movement of the second PCB in an optical axis direction.

12. The camera module of claim 1, comprising:

a fixing cap coupled to the first fixing part and the second fixing part to inhibit the first fixing part and the second fixing part from being opened, wherein the fixing cap comprises lateral walls respectively contacted to an outside of the first fixing part and an outside of the second fixing part, and an upper plate comprising an opening formed at the lateral walls.

13. The camera module of claim 12, wherein the opening exposes a connector connected to an upper surface of an uppermost board of a plurality of boards.

14. The camera module of claim 12, wherein the first fixing part comprises a through hole, and wherein the lateral walls comprise a hitching part coupled to the through hole.

15. The camera module of claim 14, wherein the upper plate comprises a separation prevention part applying a pressure to an upper surface of an uppermost board of a plurality of boards.

16. The camera module of claim 14, wherein the hitching part is formed by cutting off and bending a portion of the lateral walls, and coupled to the through hole by a hook method.

17. The camera module of claim 12, wherein a first lateral wall of the lateral walls comprises at least one prevention rib to inhibit the first lateral wall from being bent, and wherein the upper plate is integrally formed with the first lateral wall.

18. The camera module of claim 1, wherein the first protruding part of the first fixing part comprises a plurality of first protruding parts, wherein the PCB comprises a plurality of PCBs, and wherein the plurality of PCBs are respectively formed with escape grooves, each having a mutually different size, in order to inhibit interference with at least a portion of the first protruding parts among the plurality of the first protruding parts.

19. The camera module of claim 1, wherein the second protruding part comprises a plurality of second protruding parts, and wherein the second fixing part is formed with a step portion formed between the plurality of second protruding parts of the second fixing part.

20. A device for fixing a circuit board, comprising:

a first fixing part extending in a first direction, and a second fixing part extending in the first direction, wherein the first fixing part comprises a first body part, and a first protruding part inwardly protruding from the first body part,
wherein the second fixing part comprises a second body part, and a second protruding part inwardly protruding from the second body part,
wherein a printed circuit board (PCB) is disposed between the first protruding part and the second protruding part,
wherein the first protruding part is contacted with a first surface of the PCB,
wherein the second protruding part is contacted with a second surface of the PCB opposite to the first surface of the PCB,
wherein the first protruding part comprises a first bent portion bent toward the first surface of the PCB,
wherein the second protruding part comprises a second bent portion bent toward the second surface of the PCB, and
wherein respective ends of the first protruding part and the second protruding part are disposed further inward than is an outer edge of the PCB.

* * * * *